United States Patent [19]
Mori

[11] Patent Number: 5,848,020
[45] Date of Patent: Dec. 8, 1998

[54] SEMICONDUCTOR MEMORY AND METHOD OF USING THE SAME, COLUMN DECODER, AND IMAGE PROCESSOR

[75] Inventor: Toshiki Mori, Osaka, Japan

[73] Assignee: Matsushita Electric Industrial Co., Ltd., Osaka, Japan

[21] Appl. No.: 943,418

[22] Filed: Sep. 30, 1997

Related U.S. Application Data

[62] Division of Ser. No. 534,098, Sep. 26, 1995, Pat. No. 5,706,243.

[30] Foreign Application Priority Data

Sep. 27, 1994 [JP] Japan .................................. 6-231085

[51] Int. Cl.$^6$ ..................................................... G11C 7/00
[52] U.S. Cl. ............................... 365/230.06; 365/230.03; 365/230.01; 365/63
[58] Field of Search ........................ 365/230.01, 230.03, 365/230.06, 63

[56] References Cited

U.S. PATENT DOCUMENTS

| | | | |
|---|---|---|---|
| 5,394,373 | 2/1995 | Kawamoto | 365/230.06 |
| 5,428,577 | 6/1995 | Yumitori et al. | 365/203 |
| 5,436,911 | 7/1995 | Mori | 371/21.1 |
| 5,568,419 | 10/1996 | Atsumi et al. | 365/185.3 |
| 5,703,828 | 12/1997 | Park et al | 365/230.03 |
| 5,706,243 | 1/1998 | Mori | 365/230.03 |
| 5,777,943 | 7/1998 | Kim et al. | 365/230.06 |

*Primary Examiner*—Viet Q. Nguyen
*Attorney, Agent, or Firm*—McDermott, Will & Emery

[57] ABSTRACT

In a semiconductor memory for storing image data, memory cell blocks each containing a plurality of memory cells arranged in a column direction are formed such that the plurality of memory cells belonging to each of the memory cell blocks are connected with a sub word line. The above memory cell blocks are arranged in an array. There are installed a plurality of horizontal word lines and a plurality of diagonal word lines. By selecting one of the horizontal word lines, aL set of rectangular-region data of the image data is stored in the respective memory cells of the plurality of memory cell blocks placed in a given column direction. By selecting one of the diagonal word lines, sets of rectangular-region data placed in the same column are read out. Consequently, by selecting one of the horizontal word lines or one of the diagonal word lines, either or both of a set of rectangular-region data and one line of data on an image can be accessed at a high speed using a page mode cycle.

3 Claims, 23 Drawing Sheets

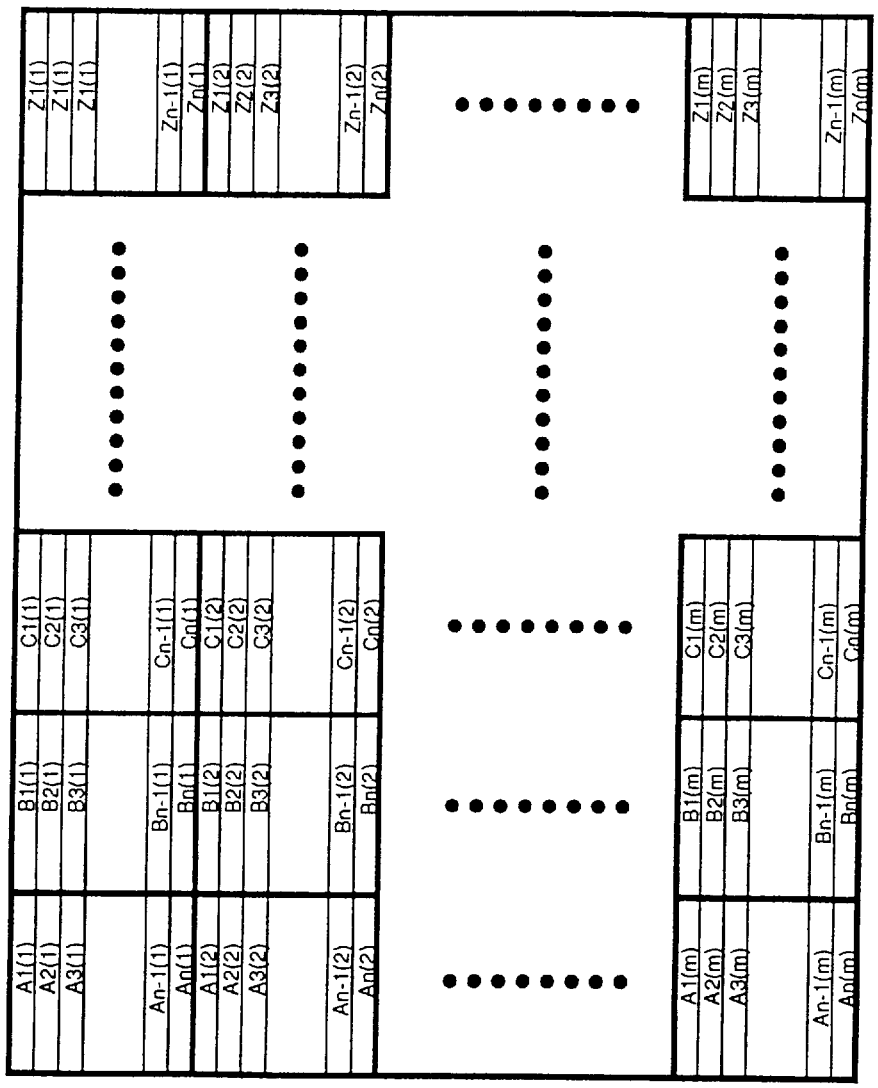

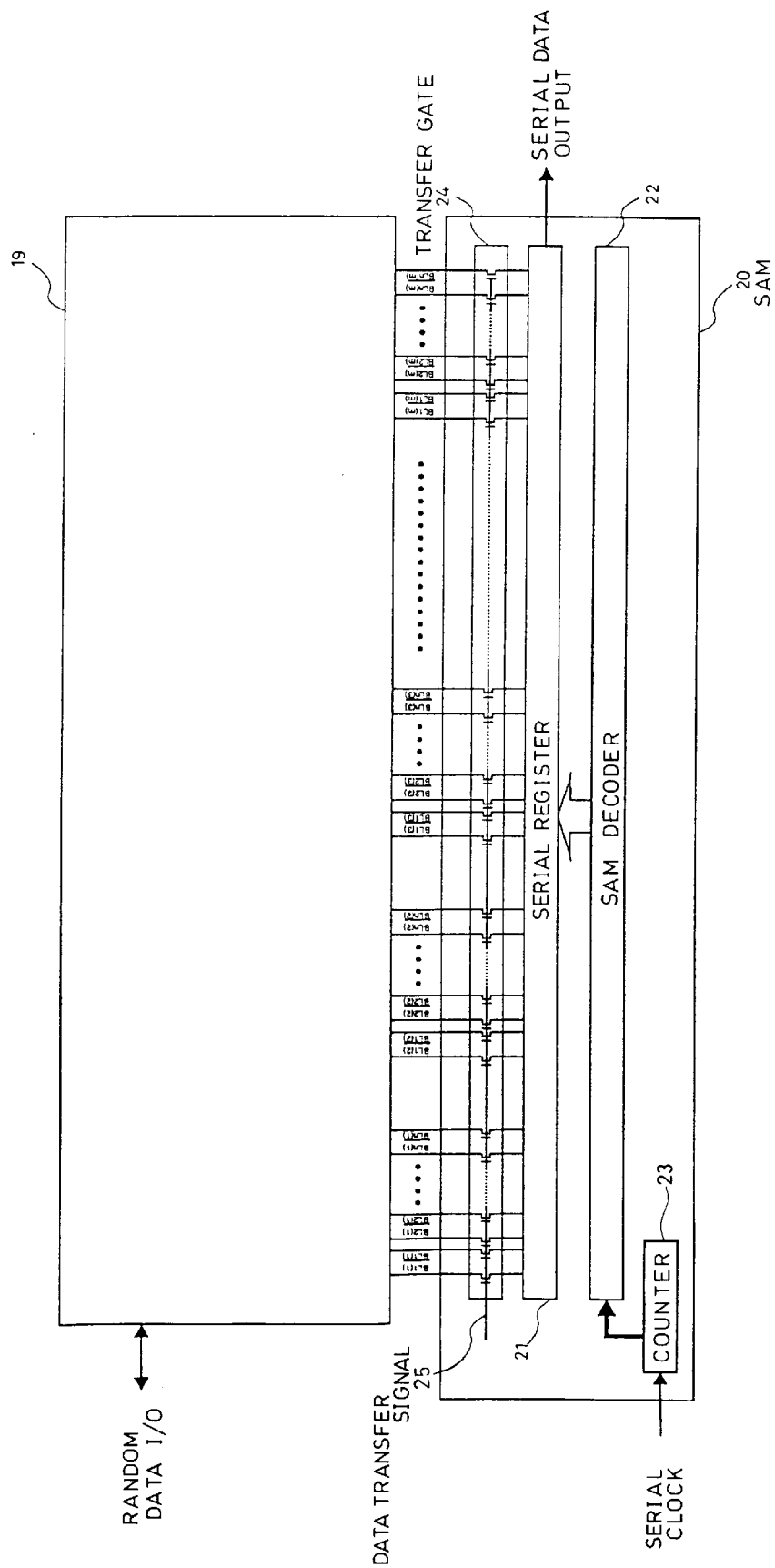

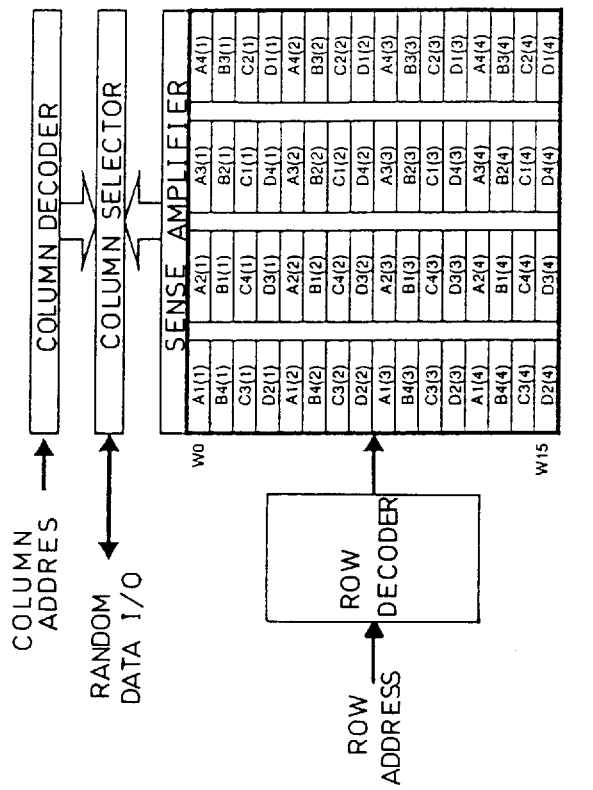
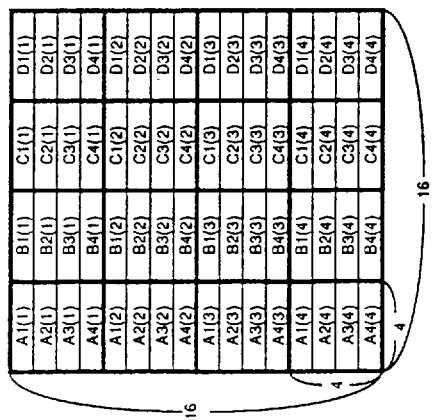
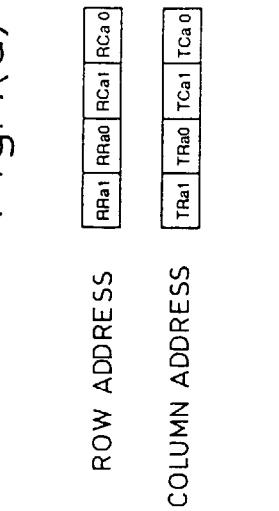

Fig.6

| | | COMBINATIONS OF TRa1 AND TRa0 | | | |
|---|---|---|---|---|---|
| RCa1 | RCa0 | 00 | 10 | 10 | 11 |
| 0 | 0 | 0001 | 0010 | 0100 | 1000 |
| 0 | 1 | 1000 | 0001 | 0010 | 0100 |
| 1 | 0 | 0100 | 1000 | 0001 | 0010 |
| 1 | 1 | 0010 | 0100 | 1000 | 0001 |

C11U, C10U, C01U, C00U

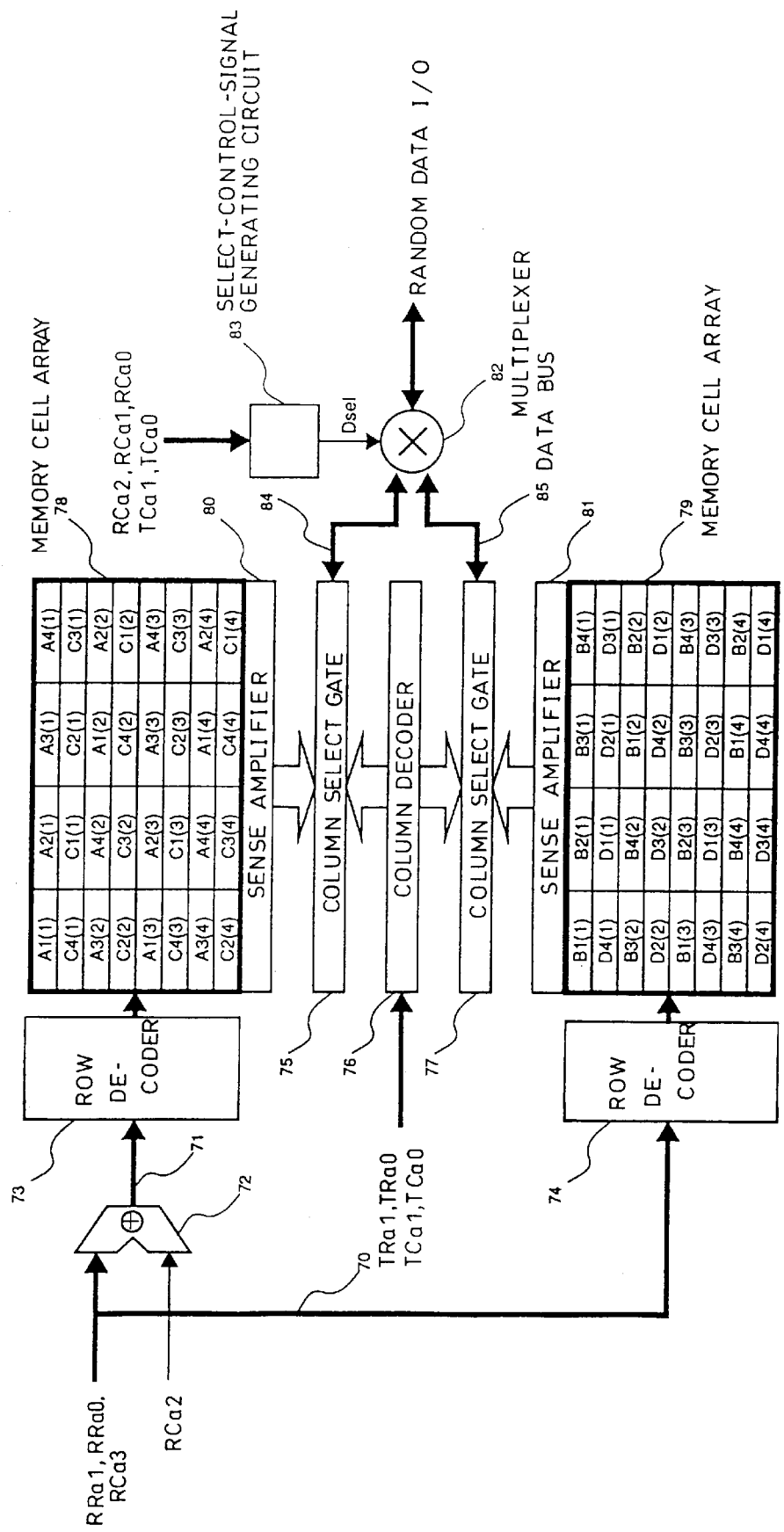

Fig.10

| RRa1 | RRa0 | RCa3 | RCa2 | AD-DRESS 73 | AD-DRESS 74 | SELL ARRAY 78 | SELL ARRAY 79 |
|---|---|---|---|---|---|---|---|
| 0 | 0 | 0 | 0 | 0 | 0 | A(1) | B(1) |
| 0 | 0 | 0 | 1 | 1 | 0 | C(1) | B(1) |
| 0 | 0 | 1 | 0 | 1 | 1 | C(1) | D(1) |
| 0 | 0 | 1 | 1 | 2 | 1 | A(2) | D(1) |
| 0 | 1 | 0 | 0 | 2 | 2 | A(2) | B(2) |
| 0 | 1 | 0 | 1 | 3 | 2 | C(2) | B(2) |
| 0 | 1 | 1 | 0 | 3 | 3 | C(2) | D(2) |
| 0 | 1 | 1 | 1 | 4 | 3 | A(3) | D(2) |
| 1 | 0 | 0 | 0 | 4 | 4 | A(3) | B(3) |
| 1 | 0 | 0 | 1 | 5 | 4 | C(3) | B(3) |
| 1 | 0 | 1 | 0 | 5 | 5 | C(3) | D(3) |
| 1 | 0 | 1 | 1 | 6 | 5 | A(4) | D(3) |
| 1 | 1 | 0 | 0 | 6 | 6 | A(4) | B(4) |
| 1 | 1 | 0 | 1 | 7 | 6 | C(4) | B(4) |
| 1 | 1 | 1 | 0 | 7 | 7 | C(4) | D(4) |
| 1 | 1 | 1 | 1 | 0 | 7 | A(1) | D(4) |

Fig.15

| RRa3 | RCa3 | RRa2 | RCa2 | ADDRESS 121 | ADDRESS 148 | ADDRESS 120 | ADDRESS 147 | CELL ARRAY 128 | CELL ARRAY 136 | CELL ARRAY 129 | CELL ARRAY 137 |
|---|---|---|---|---|---|---|---|---|---|---|---|
| 0 | 0 | 0 | 0 | 0 | 0 | 0 | 0 | A(1) | A(2) | B(1) | B(2) |
| 0 | 0 | 0 | 1 | 1 | 1 | 0 | 0 | C(1) | C(2) | B(1) | B(2) |
| 0 | 0 | 1 | 0 | 1 | 0 | 1 | 1 | C(1) | C(2) | D(1) | D(2) |
| 0 | 0 | 1 | 1 | 2 | 0 | 1 | 1 | A(3) | A(2) | D(1) | D(2) |
| 0 | 1 | 0 | 0 | 2 | 1 | 2 | 0 | A(3) | A(2) | B(3) | B(2) |
| 0 | 1 | 0 | 1 | 3 | 1 | 2 | 1 | C(3) | C(2) | D(3) | D(2) |
| 0 | 1 | 1 | 0 | 2 | 2 | 3 | 1 | C(3) | A(4) | B(3) | D(2) |
| 0 | 1 | 1 | 1 | 3 | 2 | 2 | 2 | A(3) | C(4) | B(3) | B(4) |
| 1 | 0 | 0 | 0 | 3 | 3 | 2 | 2 | A(3) | A(4) | D(3) | D(4) |
| 1 | 0 | 0 | 1 | 0 | 3 | 3 | 3 | C(3) | C(4) | D(3) | D(4) |
| 1 | 0 | 1 | 0 | 0 | 2 | 3 | 3 | C(3) | A(4) | D(3) | B(4) |
| 1 | 0 | 1 | 1 | 1 | 2 | 0 | 2 | A(1) | C(4) | B(1) | D(4) |
| 1 | 1 | 0 | 0 | 1 | 3 | 0 | 2 | A(1) | A(4) | B(1) | B(4) |
| 1 | 1 | 0 | 1 | 1 | 3 | 1 | 3 | C(1) | C(4) | D(1) | B(4) |
| 1 | 1 | 1 | 0 | 0 | 0 | 1 | 3 | C(1) | A(2) | D(1) | D(4) |
| 1 | 1 | 1 | 1 | 0 | 0 | 0 | 0 | A(1) | A(2) | B(1) | D(4) |

Fig.17

| RRa2 | RRa1,0 | TRa1,0 | | | |
|---|---|---|---|---|---|
| | | 0 | 1 | 2 | 3 |
| 0 | 0 | H | H | H | H |
| 0 | 1 | H | H | H | L |
| 0 | 2 | H | H | L | L |
| 0 | 3 | H | L | L | L |
| 1 | 0 | L | L | L | L |
| 1 | 1 | L | L | L | H |
| 1 | 2 | L | L | H | H |
| 1 | 3 | L | H | H | H |
| | | Sel1 | | | |

| RCa2 | RCa1,0 | TCa1,0 | | | |
|---|---|---|---|---|---|
| | | 0 | 1 | 2 | 3 |
| 0 | 0 | H | H | H | H |
| 0 | 1 | H | H | H | L |
| 0 | 2 | H | H | L | L |
| 0 | 3 | H | L | L | L |
| 1 | 0 | L | L | L | L |
| 1 | 1 | L | L | L | H |
| 1 | 2 | L | L | H | H |
| 1 | 3 | L | H | H | H |
| | | Sel3 | | | |

| RRa2 | RRa1,0 | TRa1,0 | | | |
|---|---|---|---|---|---|
| | | 0 | 1 | 2 | 3 |
| 0 | 0 | L | L | L | L |
| 0 | 1 | L | L | L | H |
| 0 | 2 | L | L | H | H |
| 0 | 3 | L | H | H | H |
| 1 | 0 | H | H | H | H |
| 1 | 1 | H | H | H | L |
| 1 | 2 | H | H | L | L |
| 1 | 3 | H | L | L | L |
| | | Sel2 | | | |

| RCa2 | RCa1,0 | TCa1,0 | | | |
|---|---|---|---|---|---|
| | | 0 | 1 | 2 | 3 |
| 0 | 0 | L | L | L | L |
| 0 | 1 | L | L | L | H |
| 0 | 2 | L | L | H | H |
| 0 | 3 | L | H | H | H |
| 1 | 0 | H | H | H | H |
| 1 | 1 | H | H | H | L |
| 1 | 2 | H | H | L | L |
| 1 | 3 | H | L | L | L |
| | | Sel4 | | | |

Fig.22(a)

F: INPUTTED IMAGE

Fig.22(b)

W: WEIGHTED COEFFICIENT

Fig.22(c)

G: PROCESSED IMAGE

Fig.22(d)

| 1 | 1 | 1 |
|---|---|---|
| 1 | 1 | 1 |
| 1 | 1 | 1 |

EXAMPLE 1 OF WEIGHTED COEFFICIENT

Fig.22(e)

| -1 | -1 | -1 |
|----|----|----|
| -1 | 8  | -1 |
| -1 | -1 | -1 |

EXAMPLE 2 OF WEIGHTED COEFFICIENT

Fig. 23

| | | | | | | |
|---|---|---|---|---|---|---|
| LR1 ... | f(x-2,y-1) | f(x-1,y-1) | f(x,y-1) | f(x+1,y-1) | f(x+2,y-1) | ... |
| LR2 ... | f(x-2,y) | f(x-1,y) | f(x,y) | f(x+1,y) | f(x+2,y) | ... |
| LR3 ... | f(x-2,y+1) | f(x-1,y+1) | f(x,y+1) | f(x+1,y+1) | f(x+2,y+1) | ... |

LINE REGISTERS

| | | | | | | |
|---|---|---|---|---|---|---|
| LR4 ... | -1 | -1 | -1 | -1 | -1 | ... |
| LR5 ... | 8 | 8 | 8 | 8 | 8 | ... |

| | | | | | | |
|---|---|---|---|---|---|---|
| LR6 ... | u(x-2) | u(x-1) | u(x) | u(x+1) | u(x+2) | ... |
| LR7 ... | v(x-2) | v(x-1) | v(x) | v(x+1) | v(x+2) | ... |

| | | | | | | |
|---|---|---|---|---|---|---|
| LR8 ... | g(x-2,y) | g(x-1,y) | g(x,y) | g(x+1,y) | g(x+2,y) | ... |

| | | | | | | |
|---|---|---|---|---|---|---|
| ... | PE(x-2) | PE(x-1) | PE(x) | PE(x+1) | PE(x+2) | ... |

SEMICONDUCTOR MEMORY AND METHOD OF USING THE SAME, COLUMN DECODER, AND IMAGE PROCESSOR

This is a divisional of application Ser. No. 08/534,098, filed Sep. 26, 1995 now U.S. Pat. No. 5,706,243.

BACKGROUND OF THE INVENTION

The present invention relates to an improved semiconductor memory and a method of using the same, to an improved column decoder, and to an improved image processor. More particularly, it relates to a semiconductor memory having an effective application to an image memory for use in image processing and a method of using the same, to a column decoder which eliminates the need for complicated address calculation outside the memory when image data is mapped at an appropriate position to be stored, and to an image processor comprising the above semiconductor memory and a parallel arithmetic processor and having an effective application to image processing.

An image memory is for storing image data to be used in an image processing apparatus having an image displaying function and is one of the important applications of a semiconductor memory. As the image memory, there is used a dual port memory (VRAM) comprising: a random-access memory (RAM) for storing image data; and a serial-access memory (SAM) for storing data corresponding to one line of the RAM. The VRAM enables an access to the RAM through a random port and an access to the SAM through a serial port.

In the VRAM, an access to the RAM for displaying image data is made through the serial port of the SAM using one line of data as a unit, thereby reducing the number of accesses to the RAM for displaying image data and extending the period during which an access to the RAM for image processing can be made through the random port. Therefore, the VRAM is useful for high-speed image processing.

FIG. 20 shows an example of the structure of a memory core portion of a conventional VRAM.

In the drawing, a RAM 9 is constituted by: a memory cell array composed of a large number of memory cells MC disposed at individual intersections of word lines W0 to Wn and bit lines BL0, /BL0 to BLm, and /BLm; a column decoder 1; a column select gate 2; and a sense amplifier 3, while a SAM 10 is constituted by: a data transfer gate 7 connected to the bit lines BL0, /BL0 to BLm, and /BLm; a serial register 4; a counter 6; and a SAM decoder 5.

In an access to the RAM 9 through a random port, the memory cell array is accessed via a random data I/O line. Specifically, one of the word lines is selected based on a row address and data in the memory cells connected to the selected word line is amplified by the sense amplifier 3 and then outputted onto the bit lines BL0, /BL0 to BLm, and /BLm. Thereafter, a signal from the column decoder 1 for decoding a column address drives a column select gate 2, which selectively connects a given one of the above bit lines BL0, /BL0 to BLm, and /BLm to the random data I/O line, thereby reading or writing data from or in the memory cell selected based on the row address and column address. In this manner, a random access is made to the RAM 9 through the random data I/O line.

On the other hand, in reading one line of data from the RAM 9 through the serial port of the SAM 10, one of the word lines is selected based on a row address and one line of data in the plurality of memory cells connected to the selected word line is amplified by the sense amplifier 3 and then outputted onto the bit lines BL0, /BL0 to BLm, and /BLm. By controlling a data transfer signal 8, the plural sets of data outputted onto the above bit lines BL0, /BL0 to BLm, and /BLm are transferred to the serial register 4 via the transfer gate 7. The counter 6 for counting a serial clock is caused to generate a serial address, while the SAM decoder 5 for decoding the serial address outputs a select signal, which designates a selected bit position. Accordingly, by counting up the serial clock by means of the counter 6, the plural sets of data in the serial register 4 are sequentially selected, thereby successively reading the serial data onto an output line.

FIG. 21 shows an example of the structure of an image processing system using the VRAM of FIG. 20. A VRAM 100 comprising the RAM 9 and the SRAM 10 is connected through a random port 106 to a system bus 104. Image processing by a CPU 103 is executed by making an access to the RAM 9 via the system bus 104 through the random port 106.

In the case of displaying data in the RAM 9, one line of data in the RAM 9 is transferred to the SAM 10, serially read through the serial port 107, and then given to a display unit 105, thereby displaying the data.

In this manner, the conventional VRAM can transfer one line of data in the RAM to the SRAM. Consequently, in the case of outputting data to be displayed to the display unit with the image processing system using the VRAM, the outputting of data is accomplished by transferring one line of data in the RAM to the SRAM and then serially reading the transferred data. As a result, an access to the RAM for displaying data is performed via the SRAM using one line of data as a unit, so that the number of accesses to the RAM for displaying data can be reduced.

However, in order to constitute the VRAM such that image data is stored in the RAM and that one line of data is transferred to the SRAM as the data to be displayed, a one-to-one correspondence should be provided between the address of the stored image data on a display screen and the address thereof in the RAM. In other words, data in a line (column) direction on the display screen should be stored in the memory cells aligned along one of the word lines in the RAM. Consequently, in the case of making an access to data in a rectangular region of the image data in two-dimensional layout (hereinafter referred to as a set of rectangular-region data), the access cannot be made in a page mode cycle of the memory, i.e., in a mode in which a high-speed access is made with respect to the plurality of memory cells on the same word line by varying only the column address, so that it becomes necessary to switch to another word line several times. Therefore, it is difficult to perform high-speed image display.

The conventional VRAM is also disadvantageous in that it cannot excel a general-purpose DRAM in the speed at which an access is made to the RAM through the random port, since the conventional VRAM is aimed at extending the period during which an access to the RAM for image processing can be made through the random port by reducing the number of accesses to the RAM for displaying data and hence is equal to the general-purpose DRAM in the function of making an access to the RAM storing image data through the random port.

To be more specific about the speed at which an access is made to the above RAM through the random port, since a graphics system and an image processing system, e.g., are for processing image data laid out in two dimensions, if a high-speed access can be made to a set of rectangular-region data of the image data laid out in two dimensions, processing performance can be enhanced. Although the enhancement of graphics-drawing ability has been required in the graphics system and an increase in the processing speed at which an image is compressed/expanded has been required in the image processing system, if a correspondence is provided between a plurality of memory cells aligned along a word line in a RAM and a set of rectangular-region image data such that an access can be made to the rectangular-region data in the page mode cycle of the memory, high-speed operation can be intended. However, since the one-to-one correspondence should be provided between the address on the screen and the address in the RAM in the conventional VRAM as described above, data in a line direction of the image data has been stored in the memory cells aligned along one of the word lines in the RAM. Consequently, the above requirement that a correspondence should be provided between a plurality of memory cells aligned along one of the word lines in the RAM and a set of rectangular-region image data cannot be satisfied, so that the speed at which an access is made through the random port cannot be increased.

On the other hand, in the case where a general-purpose DRAM, instead of the above-mentioned VRAM, adopts the structure in which a correspondence is provided between a plurality of memory cells along a word line of a RAM and a set of rectangular-region data of image data so that an access can be made to the rectangular-region data in the page mode cycle of the memory, one line of data in the RAM cannot be transferred to a SAM at one time if it becomes necessary to display the image data on the display screen, but only one line of data at a time. Consequently, switching to another word line is required several times in order to display one line of data on the display screen, which makes it difficult to perform high-speed image display.

SUMMARY OF THE INVENTION

An object of the present invention is to provide a semiconductor memory wherein a high-speed access to the RAM for each of a set of rectangular-region data and one line of data on the display screen can be made through the random port in the page mode cycle of the memory, a method of using the semiconductor memory, and an image processor using the semiconductor memory.

To attain the above object, the semiconductor memory of the present invention comprises: a memory cell array having a plurality of memory cell blocks in each of which a single or a plurality of memory cells arranged in a column direction are connected to a sub word line, the above plurality of memory cell blocks being arranged in an array; horizontal word lines extending in horizontal directions and diagonal word lines extending in diagonal directions; and a word-line selecting means for receiving a word-line select signal, selecting a given one of the above horizontal or diagonal word lines based on the word-line select signal which has been received, and connecting the selected word line to the above sub word line in each of the memory cell blocks corresponding to the word line, wherein those ones of the above plurality of memory cell blocks which are arranged in one of the horizontal directions or in one of the diagonal directions are selected based on the word-line select signal and sets of data in the plurality of memory cells in the plurality of selected memory cell blocks arranged in the horizontal direction or in the diagonal direction are outputted onto respective pairs of bit lines.

The image processor of the present invention comprises: the above semiconductor memory; a register file composed of a plurality of line registers for receiving and storing sets of data from the bit lines of the above semiconductor memory; and a parallel arithmetic unit having a plurality of arithmetic circuits each for fetching in parallel the sets of data stored in the line registers of the above register file and performing an arithmetic operation using the sets of fetched data.

In the semiconductor memory of the present invention thus constituted, a set of rectangular-region image data laid out in two dimensions can be accessed at a high speed using the page mode cycle by selecting one of the horizontal word lines in response to the word-line select signal, while one line of data can be accessed at a high speed using the page mode cycle by selecting one of the diagonal word lines in response to the word-line select signal. Consequently, it becomes possible to make a high-speed access to each of the set of rectangular-region data and one line of data using the page mode cycle.

In the image processor of the present invention, each of the set of rectangular-region data and one line of data read from the above-mentioned semiconductor memory is latched into a register file and arithmetic operations are performed in parallel using the inputted data, thus implementing a high-speed image processor.

Another object of the present invention is to provide a column decoder particularly suitable for the above-mentioned semiconductor memory, which does not require the provision of a complicated address arithmetic mechanism outside the semiconductor memory.

Still another object of the present invention is to provide a semiconductor memory which allows, even when plural sets of rectangular-region data preliminarily formed are stored therein, image data in a rectangular region starting at an arbitrary position in a horizontal direction to be accessed at a high speed using the page mode cycle and a semiconductor memory which allows, even when plural sets of rectangular-region data preliminarily formed are stored therein, image data in a rectangular region starting at an arbitrary position both in common inside-a horizontal direction and in a line direction to be accessed at a high speed using the page mode cycle.

The above objects and novel features of the present invention will be more apparent from the reading of the following description in conjunction with the accompanying drawings.

BRIEF DESCRIPTION OF THE DRAWINGS

The accompanying drawings show the preferred embodiments of the present invention.

In the drawings:

FIG. 2 is a view showing the address mapping of image data stored in the semiconductor memory of FIG. 1;

FIG. 3 is a view showing an example of the structure of a video memory according to a second embodiment of the present invention;

FIG. 4(a) is a view showing the address mapping of image data;

FIG. 4(b) is a view showing the address of the image data stored in the video memory;

FIG. 4(c) is a view showing a rectangular-region address and an inside-rectangular-region address;

FIG. 4(d) is a view showing a row address and a column address;

FIG. 6 is a view for illustrating the function of shifting the bits of an inputted address in a column direction in the column decoder of FIG. 5;

FIG. 9 is a view showing an example of the structure of a semiconductor memory according to a fourth embodiment of the present invention;

FIG. 10 is a view showing the relationship among an inputted address, a row address, and selected data in the semiconductor memory of FIG. 9;

FIG. 15 is a view showing the relationship among an inputted address, a row address, and selected data in the semiconductor memory of FIG. 14;

FIG. 17 is a view for illustrating the operation of the select-control-signal generating circuit of FIG. 16;

FIGS. 22(a)–(e) are views for illustrating a local-space product-sum operation; and FIG. 23 is a view for illustrating the process of the local-space product-sum operation.

DETAILED DESCRIPTION OF THE INVENTION

Below, the preferred embodiments of the present invention will be described with reference to the accompanying drawings.

(First Embodiment)

Figure 1:
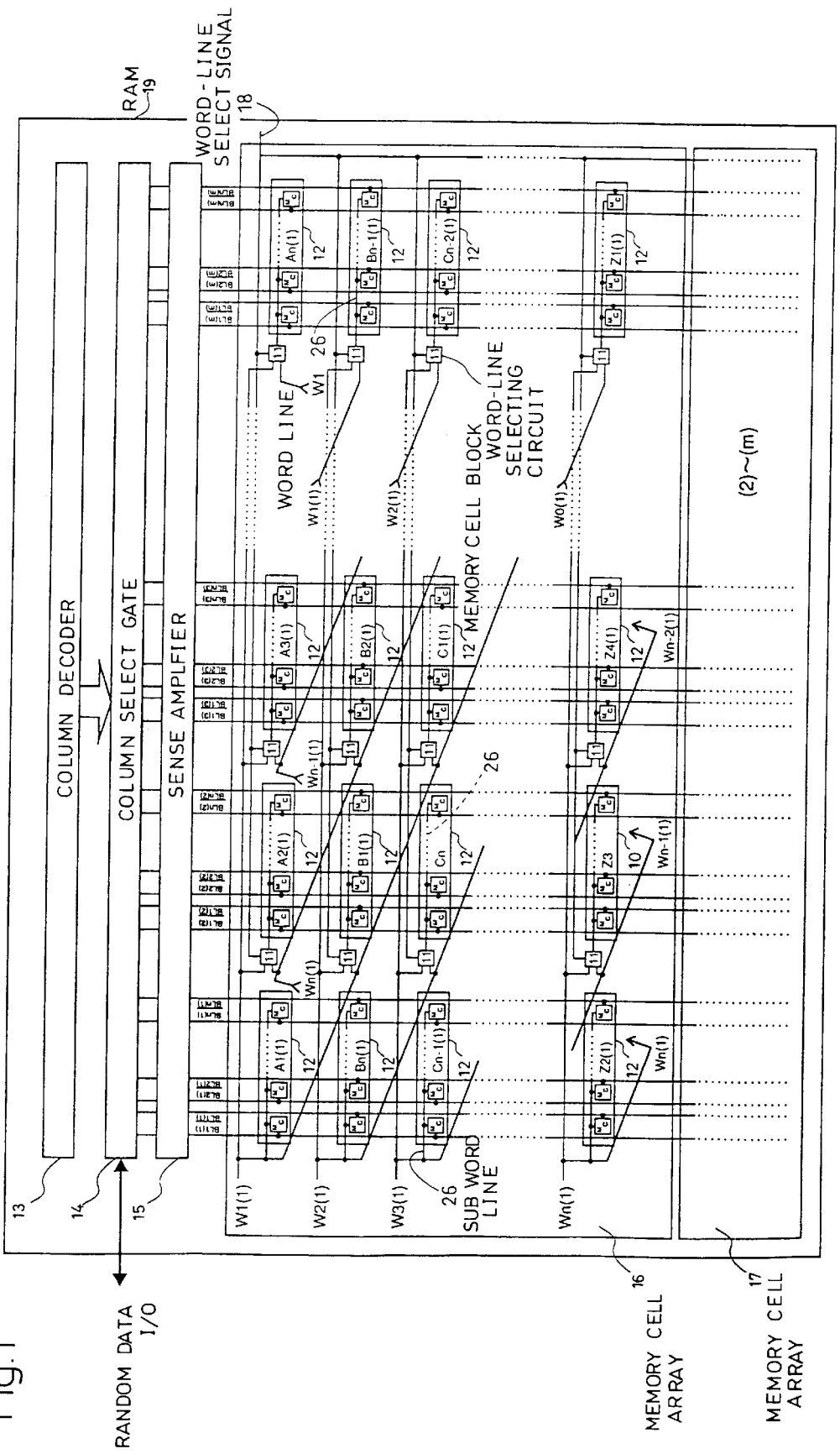
FIG. 1 is a view showing an example of the structure of a semiconductor memory according to a first embodiment of the present invention.

FIG. 1 shows an example of the structure of a memory core portion of a semiconductor memory according a first embodiment of the present invention.

In the drawing are shown: memory cell blocks 12 each composed of a plurality of memory cells MC which are aligned in column directions and connected to respective sub word lines 26; and word-line selecting circuits 11 for selecting a word-line signal to be supplied to each of the memory cell blocks 12, which are aligned in row directions as well as in diagonal directions in such a manner as to connect the memory cell blocks 12. The word-line selecting circuits 11 are controlled by a word-line select signal 18. The sub word lines 26 in the respective memory cell blocks 12 are driven by the outputs from the corresponding word-line selecting circuits 11.

There are also shown word lines W1(1) to Wn(1), which are connected to the respective word-line selecting circuits 11 described above. For simplification, a memory cell array 17 shown in FIG. 1 comprises a plurality of memory cell arrays 16. The above memory cell arrays 16 and 17 constitute an entire memory cell array.

A RAM 19 consists of: the above memory cell arrays 16 and 17; a column decoder 13; a column select gate 14; and a sense amplifier 15.

In an access to the memory cell arrays 16 and 17, sets of data in the memory cells connected to a word line selected based on a row address are amplified by the sense amplifier 15 and then outputted onto bit lines BL1(1), /BL1(1) to BLn(m), and /BLn(m). On the other hand, the column select gate 14 driven by a signal from the column decoder 13 for decoding a column address selectively connects one of the bit lines BL1(1), /BL1(1) to BLn(m), and /BLn(m) to a random data I/O line, thereby making a random access to the memory cell arrays 16 and 17 via the random data I/O line.

Below, a description will be given to a correspondence between image data and the memory cells in the case of storing the image data in the memory shown in FIG. 1.

The image data is shown in FIG. 2. A set of rectangular-region data A1(1) to An(1) of the image data is stored in the memory cell blocks A1(1) to An(1) in the column direction, which are selected by means of the word line W1(1). A set of rectangular-region data B1(1) to Bn(1) of the image data is stored in the memory cell blocks B1(1) to Bn(1) in the column direction, which are selected by means of the word line W2(1). Likewise, sets of rectangular-region data C1(1) to Cn(1) to Z1(1) to Zn(1) on a display screen are stored in the memory cell blocks C1(1) to Cn(1) to Z1(1) to Zn(1) in the column directions, which are selected by means of the word lines W3(1) to Wn(1), respectively.

In storing the individual sets of rectangular-region data A1(1) to An(1), B1(1) to Bn(1), . . . , Z1(m) to Zn(m) in the respective memory cells MC of FIG. 1, the first set of rectangular-region data A1(1) to An(1) is stored such that the first data component A1(1) corresponds to the memory cell block 12 on the left end of FIG. 1. As for the next set of rectangular-region data B1(1) to Bn(1), it is stored such that the first data component B1(1) corresponds to the memory cell block 12 at a position shifted in the column direction by one memory cell block. Likewise, the sets of rectangular-region data C1(1) to Cn(1) to Z1(m) to Zn(m) are stored such that their first data components C1(1), . . . , and Z1(m) correspond to the memory cell blocks 12 at positions sequentially shifted in the column directions by one memory cell block each.

By providing such a correspondence between the image data and the memory cells, the set of rectangular-region data A1(1) to An(1) corresponds to the memory cells arranged in a line in the column direction.

Accordingly, when the word-line selecting circuits 11 are controlled by the word-line select signal 18 as a signal for driving the sub word line 26 of each of the memory cell blocks 12 so as to select one of the word lines extending in the column directions, if the word line W1(1) is selected, the memory cells corresponding to the set of rectangular-region data A1(1) to An(1) can be selected. Similarly, by selecting any one of the word lines W1(1) to Wn(1), any one of the sets of rectangular-region data A1(1) to An(1) to Z1(1) to Zn(1) of the image data can be selected.

On the other hand, when the word-line selecting circuits 11 are controlled by the word-line select signal 18 as the signal for selecting the sub word line 26 of each of the memory cell blocks 12 so as to select one of the word lines extending in the diagonal directions, if the word line W1(1) is selected, the memory cells corresponding to one line of data A1(1) to Z1(1) of the image data can be selected. Similarly, by selecting one of the word lines W1(1) to Wn(1), one line of data A1(1) to Z1(1) on the image data can be selected.

In the memory cell array 17 are placed the plurality of memory cell arrays 16, in which the sets of rectangular-region data A1(2) to Zn(2) to A1(m) to Zn(m) of the image data shown in FIG. 2 are stored. All the word-line selecting circuits 11 in the memory cell arrays 16 and 17 are simultaneously controlled by the word-line select signal 18.

Here, when the size of the image data of FIG. 2 is 1024×1024 pixels and when the size of each of the sets of rectangular-region data A1(1) to Zn(1) to A1(m) to Zn(m) is 32×32 pixels, the number of the memory cells in each of the memory cell blocks 12 is set at 32, the number of memory cell blocks in the column direction is set at 32, and the number of word lines extending in the column directions is set at 1024, thereby constituting a memory cell array wherein data of 32×32=1024 bits, which corresponds to one set of rectangular-region data of the image data, is stored in the memory cells in one line.

Thus, by constituting the semiconductor memory having the memory core portion shown in FIG. 1, a high-speed access can be made using a page mode cycle of the semiconductor memory with respect to both of a set of rectangular-region data for drawing graphics in an arbitrary direction and one line of data for drawing a straight line in a graphics system or to both of a set of rectangular-region data for compressing/expanding an image and one line of data for image display in an image processing system. In this manner, there can be implemented a semiconductor memory which enables high-speed image processing.

(Second Embodiment)

In the case of applying the semiconductor memory of the first embodiment shown in FIG. 1 to an image processing system having an image displaying function, a serial access function is imparted to the semiconductor memory so as to implement a video memory which has the serial access function for image display and which enables a high-speed access through a random port to a RAM and therefore high-speed image processing.

FIG. 3 shows an example of the structure of a semiconductor memory (video memory) of a second embodiment of the present invention, which has the serial access function.

In the drawing are shown: a RAM portion 19 having the same structure as that of the semiconductor memory of the present invention having a random access function shown in FIG. 1; and a SAM (serial access memory) 20 consisting of a transfer gate (transfer means) 24, a serial register 21, a counter 23, and a SAM decoder 22, which has been connected to the bit lines BL0(1), /BL0(1) to BLn(m), and /BLn(m) of the RAM 19.

In the structure shown in FIG. 3, an access to the RAM 19 through the random port via the random data I/O line is the same as described above with reference to FIG. 1.

In reading one line of data from the RAM 19 through the SAM 20 to a serial port, one line of data in the memory cells connected to a word line selected based on a row address is initially amplified by the sense amplifier 15 of FIG. 1 and then outputted onto the bit lines BL0, /BL0 to BLm, and /BLm. By controlling a data transfer signal 25, the data outputted onto the above bit lines BL0, /BL0 to BLm, and /BLm is transferred through the transfer gate 24 to the serial register 21. Since the bit position of a selected one of the sets of data transferred to the serial register 21 is designated by a select signal from the SAM decoder 22 for decoding a serial address generated from the counter 23 for counting a serial clock, the sets of data in the serial register 21 are sequentially selected by counting up the serial clock by means of the counter 23, thereby successively reading the sets of data onto a serial-data output line.

Figure 21:
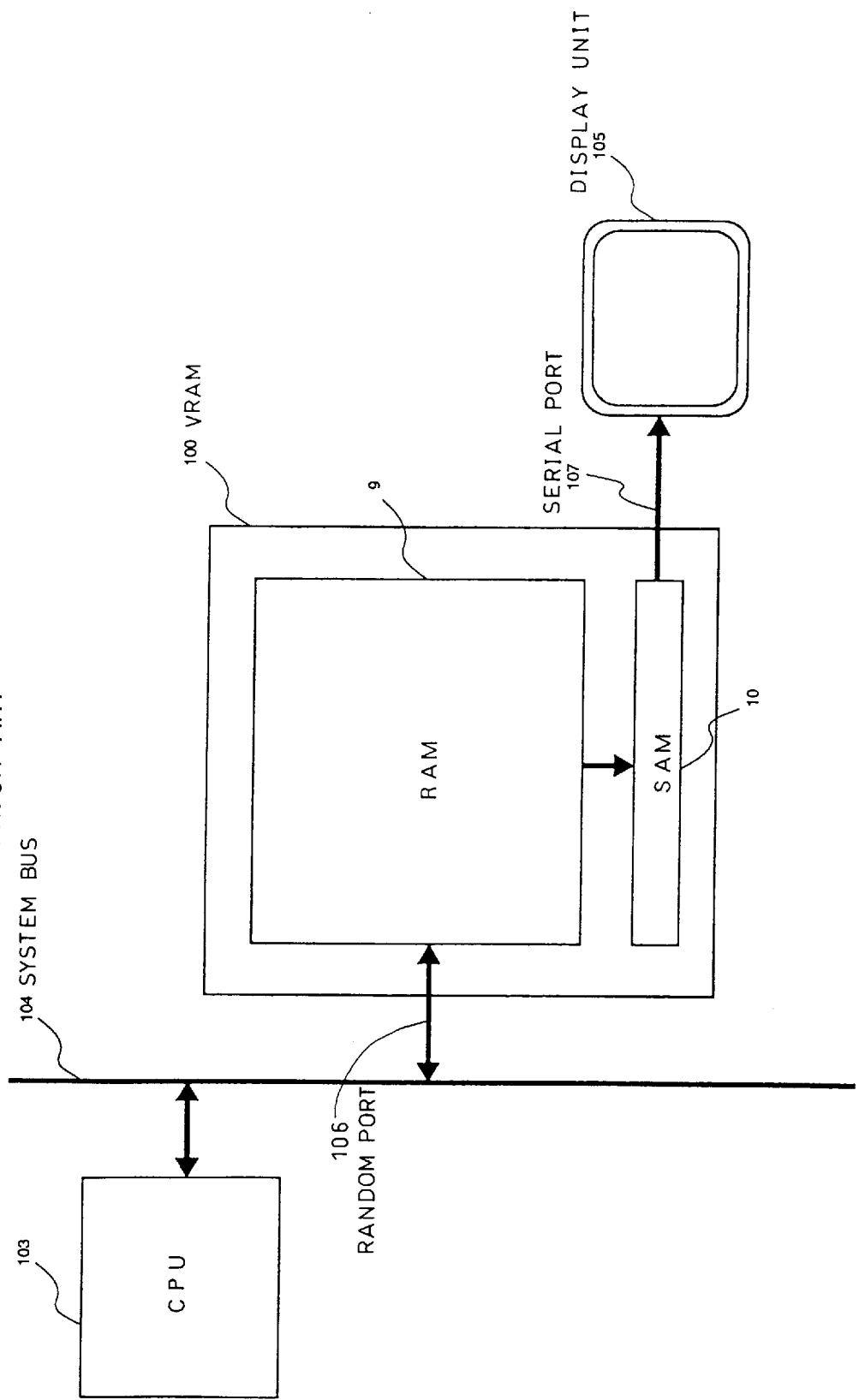
FIG. 21 is a view showing an example of the structure of an image processing apparatus using the conventional video memory.

Here, consideration will be given to the case where the semiconductor memory of the present embodiment shown in FIG. 3 is used as an image memory and image data is stored in the RAM 19. In this case, it is assumed that the correspondence shown in FIGS. 1 and 2 has been provided between the image data and the image memory. In an image processing system using the image memory shown in FIG. 21, if the memory cell blocks in the column direction are selected by switching the word-line selecting circuits 11 in the case of making an access from the CPU 103, a set of rectangular-region data of an image can be accessed by selecting one of the word lines. Since the data in a rectangular region can be accessed at a high speed using the page mode cycle of the memory, it becomes possible to execute high-speed image processing through the random port 106.

In the case of displaying the data in the RAM 19, on the other hand, the memory cell blocks aligned in the diagonal direction are selected by switching the word-line selecting circuits 11 and one line of data of the image data (A1(1) to Z1(1)) (1024 bits) is accessed by selecting one of the word lines. The accessed data is transferred to the SAM 20, serially read through the serial port 107, and given to the display device 105, thereby displaying the data.

As described above, the video memory comprising the RAM 19 and the serial register 21 and having the serial access function is so constituted that the control signal given from the outside sets a transfer mode in which one line of data in the RAM is transferred to the serial register 21. Consequently, the operation of the present embodiment can easily be implemented by controlling the word-line select signal 18 such that, when the above transfer mode is set in the video memory of the present embodiment, the word-line selecting circuits 11 of FIG. 1 select the plurality of memory cell blocks in the diagonal direction.

By thus constituting the memory core portion as shown in FIG. 3, it becomes possible to make a high-speed access to a set of rectangular-region data on an image by using the page mode cycle when image processing is executed by the CPU and to make a high-speed access to one line of data on the image when the access is made for display. Consequently, there can be implemented a video memory which enables data processing at a high speed.

(Third Embodiment)

The correspondence between the image data and the memory cells shown in FIGS. 1 and 2 is determined by addresses given to the VRAM 100 when the image data is written in the RAM. Hence, there is no particular functional requirement placed on the semiconductor memory. However, an address converting function should be provided outside the semiconductor memory.

Specifically, it should be arranged that the column address of the memory corresponding to the set of rectangular-region data B1(*) to Bn(*) (* is any one of 1 to m) on an image is placed at positions shifted in the column direction by one memory cell block from the column address corresponding to A1(*) to An(*). Similarly, it is required to arrange that the sets of rectangular-region data C1(*) to Cn(*) to Z1(*) to Zn(*) are sequentially placed at positions shifted in the column directions by one memory cell block each. Thus, to provide the correspondence between the image data and the memory cells shown in FIGS. 1 and 2, a complicated address converting circuit should be provided outside the memory.

In view of the foregoing, the present embodiment provides a column decoder which does not require the provision of the address converting function outside the semiconductor memory.

Below, a description will be given to the column decoder of the present embodiment.

For simplification, it is assumed that the image data is composed of 16×16 pixels and divided into rectangular regions each composed of 4×4 pixels, as shown in FIG. 4(a) and that the image data is stored in the memory shown in FIG. 4(b). FIG. 4(c) shows addresses for designating one rectangular region of 4×4 pixels in the image data of 16×16 pixels. The addresses required to designate one rectangular region of 4×4 pixels of the image data of 16×16 pixels is composed of 4 bits, of which the address for designating the line direction is RRa1 and RRa0 and the address for designating the horizontal direction is RCa1 and RCa0. Each of the rectangular regions comprises four lines each composed of 4 pixels. If it is assumed that an access is made to each of the 16 pixels in the rectangular region, the address required to designate one of the pixels in the rectangular region (hereinafter referred to as inside-rectangular-region address) is composed of 4 bits, of which the address for designating the line direction is TRa1 and TRa0 and the address for designating the horizontal direction is TCa1 and TCa0.

FIG. 4(b) shows the layout of data in the memory in which the image data shown in FIG. 4(a) is stored. In the drawing, W0 to W15 designate word lines, on each of which 16-bit memory cells are placed. Each set of the rectangular-region data of the image data shown in FIG. 4(a) is stored in the memory cells in the horizontal direction. With the addresses of the image data designated as shown in FIG. 4(c), the rectangular-region address RRa1, RRa0, RCa1, and RCa0 corresponds to a row address, while the inside-rectangular-region address TRa1, TRa0, TCa1, and TCa0 corresponds to a column address in the memory shown in FIG. 4(b), as shown in FIG. 4(d).

Figure 5:
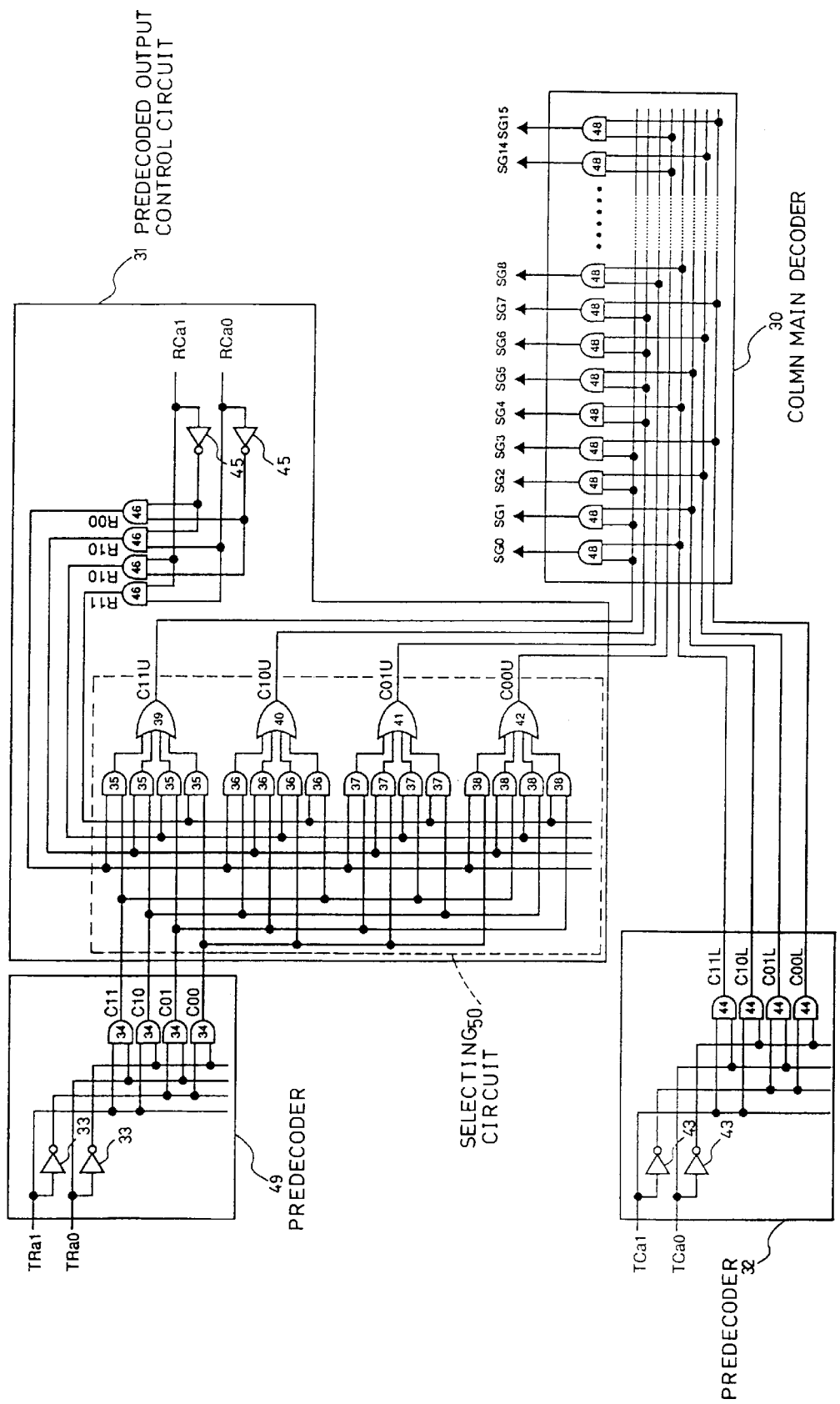
FIG. 5 is a view showing an example of the structure of a row-address-dependent column decoder according to a third embodiment of the present invention.

FIG. 5 shows an example of the structure of the column decoder of the present embodiment.

In the drawing are shown: a first predecoder 49; a second predecoder 32; a predecoded output control circuit (predecoded output switching means) 31 for controlling the output from the predecoder 49 based on the row address; and a column main decoder (main decoder) 30.

The predecoder 32 is supplied with the column address TCa1 and TCa0 for designating the memory cells in the memory cell block and outputs predecode signals C00L to C11L which are four combinations of the inputted 2-bit address TCa1 and TCa0 and any one of which is asserted by means of two inverters 43 and four AND gates 44.

The predecoder 49 is supplied with the column address TRa1 and TRa0 for designating one of the plurality of memory cell blocks selected by one of the word lines and outputting the predecode signals C00 to C11 which are four combinations of the inputted 2-bit address TRa1 and TRa0 and any one of which is asserted by means of two inverters 33 and four AND gates 34.

The predecoded output control circuit 31 is supplied with the RCa1 and RCa0, which are the lower 2 bits of the 4-bit row address for designating one of the word lines, and with the output C00 to C11 from the predecoder 49. The predecoded output control circuit 31 outputs predecode signals R00 to R11, which are four combinations of the above 2-bit row address RCa1 and TCa0 and one of which is asserted by means of two inverters 45 and four AND gates 46. Sixteen AND gates 35 to 38 and four OR gates 39 to 42 constitute a selecting circuit 50 which changes the order of the output signals C00 to C11 based on the predecoded signals R11 to R00 of the row address RCa1 and RCa0 and outputs them as signals C00U to C11U.

The column main decoder 30 receives the outputs C00L to C11L from the predecoder 32 and the outputs C00U to C11U from the predecoded output control circuit 31 and outputs, by means of a plurality of AND gates 48, signals SG0 to SG15 for controlling a column select gate for selecting one of the memory cells.

With the above structure, the outputs C00U to C11U from the predecoded output control circuit 31 depend on the row address RCa1 and RCa0 and the outputs dependent on the combinations of the address TRa1 and TRa0 are as shown in FIG. 6.

As is apparent from FIG. 6, the output signals C00U to C11U from the predecoded output control circuit 31 are obtained by asserting the predecoded outputs C00 to C11 of the line address TRa1 and TRa0 in a rectangular region of the image data at sequentially shifted bit positions depending on the values of the RCa1 and RCa0 corresponding to the rectangular-region in the horizontal direction.

The column main decoder 30 has decoded the outputs C00U to C11U of the predecoded output control circuit 31 and the outputs C00L and C11L from the predecoder 32 and, even when it is receiving the same column address signals TRa1, TRa0, TCa1, and TCa0, it depends on the lower 2 bits RCa1 and RCa0 of the row address and outputs column-select-gate control signals SG0 to SG15 so as to select different memory cell blocks.

If the image data shown in FIG. 4(a) is stored in the semiconductor memory by means of the column decoder shown in FIG. 5, the layout of the image data in the memory becomes as shown in FIG. 4(b).

Thus, by constituting the column decoder as shown in FIG. 5, there can be implemented a column selecting circuit of simple structure in which the position at which the address for designating one of the pixels is sequentially shifted in the column direction based on the row address.

Consequently, in the case of storing the image data shown in FIG. 4(a) in the semiconductor memory, mapping as shown in FIG. 4(b) can be achieved without complicated address calculation outside the memory, which is extremely useful in simplifying the system using an access to a rectangular region.

(Fourth Embodiment)

As described above, the performance of the graphics system or of the image processing system can be improved by enabling a high-speed access to a rectangular region. In FIGS. 2 and 4, however, the whole image data has been divided at a fixed position into rectangular regions having a given size. Although the method is effective in making a high-speed access to a set of rectangular-region data starting at a fixed pixel position, an access using the page mode cycle cannot be made to a set of rectangular-region data starting at an arbitrary pixel position.

Figure 7A:
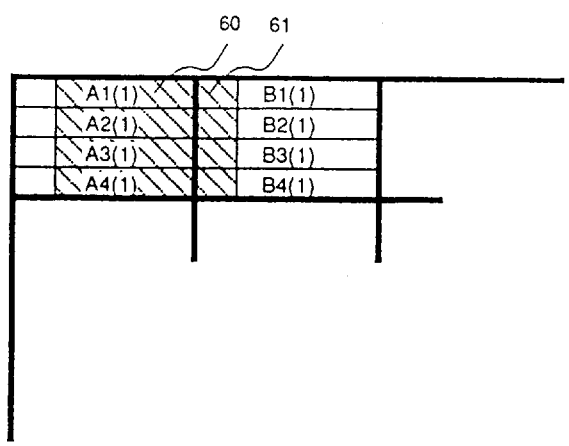
FIG. 7(a) is a view showing image data obtained through an access at an arbitrary horizontal position.
Figure 7B:
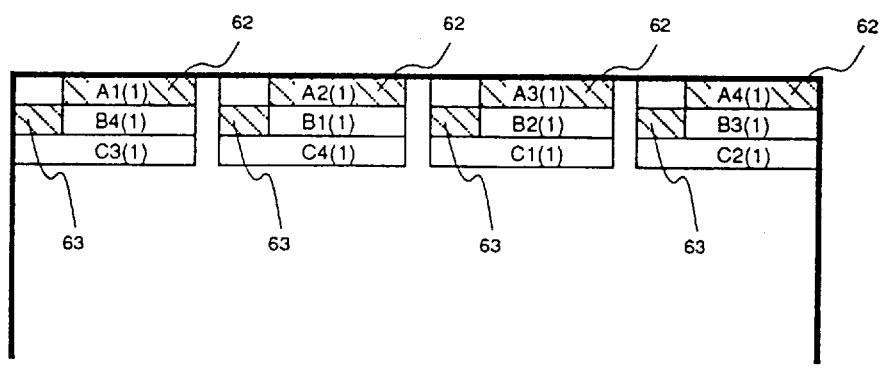
FIG. 7(b) is a view showing the position at which the image data of FIG. 7(a) is stored in a memory.

With the image data divided into the rectangular regions and mapped in the semiconductor memory as shown in FIGS. 4(a) and 4(b), the image data in hatched regions 60 and 61 over the boundary between the two rectangular regions is stored in the memory cells 62 and 63 in different lines in the semiconductor memory shown in FIG. 7(b). As a result, an access using the page cycle of the memory cannot be made to the rectangular regions designated by the reference numerals 60 and 61. In the case of performing image processing through the random port, a technique of switching the row address in the memory each time the boundary between the rectangular regions 60 and 61 shown in FIG. 7(a) is changed in the image data or a technique of dividing a region subjected to image processing into the rectangular regions 60 and 61 and performing processing with respect to both of them in parallel becomes necessary, resulting in a factor in inhibiting higher-speed processing in making an access to a rectangular region.

The present embodiment provides a semiconductor memory with an increased processing ability by enabling a high-speed access to a set of rectangular-region data starting at an arbitrary pixel position in the horizontal direction.

Below, a description will be given to the structure of the semiconductor memory of the present embodiment.

Figure 8A:
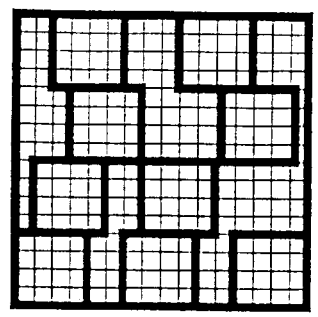
FIG. 8(a) is a view showing rectangular-region data at an arbitrary horizontal position.
Figure 8B:
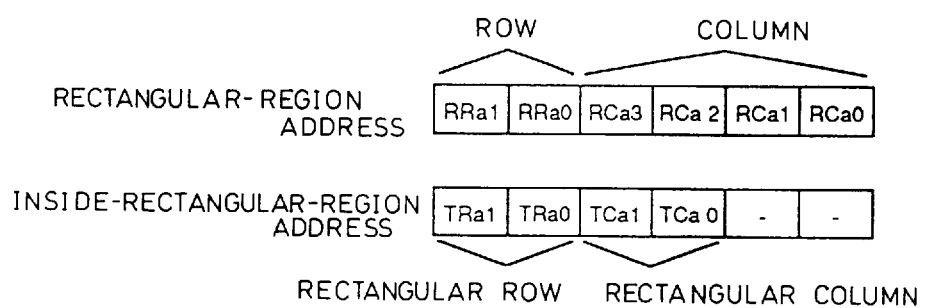
FIG. 8(b) is a view showing the addresses of image data when the rectangular-region data of FIG. 8(a) is accessed.

FIG. 8(a) shows image data in the case of making an access to a rectangular region starting from an arbitrary pixel position in the horizontal direction. FIG. 8(b) shows image addresses for the image data. As shown in FIG. 8(a), in order to pick up a rectangular region composed of 4×4 pixels from the image data composed of 16×16 pixels such that an access is made thereto and to designate an arbitrary position in the horizontal direction at which the rectangular region starts, 2 bits (RRa1, RRa0) in the line direction and 4 bits (RCa3 to RCa0) in the horizontal direction are needed as a rectangular-region address, as shown in FIG. 8(b). In order to designate one of the pixels in the rectangular region, 2 bits (TRa1, TRa0) in the line direction and 2 bits (TCa1, TCa0) in the horizontal direction are needed.

FIG. 9 shows the structure of a semiconductor memory which receives the image addresses shown in FIG. 8(b) and implements a high-speed access to the rectangular-region data starting at an arbitrary position in the horizontal direction.

In FIG. 9, reference numerals 79 and 78 designate memory cell arrays (first array portion and second array portion) formed by halving the memory cell array shown in FIG. 4(b). In each of the memory cell arrays is stored rectangular-region data as shown in FIG. 9. Reference numerals 74 and 73 designate first and second row decoders, respectively. To the first row decoder 74 is inputted an address RRa1, RRa0, and RCa3. To the second row decoder 73 is inputted the address obtained by adding an address RCa2 to the address inputted to the first row decoder 74. The first and second row decoders 74 and 73 generate respective signals for selecting one of the word lines in the memory cell array 78 and for selecting one of the word lines in the memory cell array 79.

With the above structure, the respective addresses 70 and 71 supplied to the row decoders 73 and 74 and data in the memory cell arrays 78 and 79 selected based on the supplied addresses 70 and 71 are as shown in FIG. 10. As can be seen from FIG. 10, sequential sets of rectangular-region data in the column direction in the memory cell arrays 78 and 79 are selected based on the addresses RRa1, RRa0, RCa3, and RCa2 supplied to the row decoders 73 and 74. Accordingly, in the example shown in FIG. 7, the sets of data A1(1) to A4(1) and the B1(1) to B4(1) in the respective memory cell arrays 78 and 79 are simultaneously accessed in the memory in making an access to the regions 60 and 61 of the image data shown in FIG. 7(a).

In FIG. 9, reference numerals 81 and 80 designate first and second sense amplifiers for individually amplifying respective sets of data on bit lines of the respective memory cell arrays 78 and 79. Reference numerals 77 and 75 designate first and second column select gates for selectively connecting the bit lines of the respective memory cell arrays 78 and 79 to data buses 85 and 84. A reference numeral 76 designates a column decoder supplied with the inside-rectangular-region address TR1a, RTa0, TCa1, and TCa0 and supplying a common select signal to the column select gates 75 and 77.

In the above structure, for the two sets of rectangular-region data in the memory cell arrays 78 and 79 selected based on the rectangular-region address RRa1, RRa0, RCa3, and RCa2, sets of pixel data at the same positions of the two sets of rectangular-region data designated by the inside-rectangular-region address TRa1, TRa0, TCa1, and TCa0 are selected by the column select gates 77 and 75 and connected to the data buses 85 and 84.

A select-control-signal generating circuit (select-control-signal generating means) 83 is a circuit for generating a signal for controlling a multiplexer (data selecting means) 82 such that it selects either one of the two sets of rectangular-region data selected by the column decoder 76 and column select gates 77 and 75. The multiplexer 82 is controlled by a control signal output Dsel so as to select either one of the data buses 85 and 84 and connect the selected one to a random data I/O line.

Figure 11:
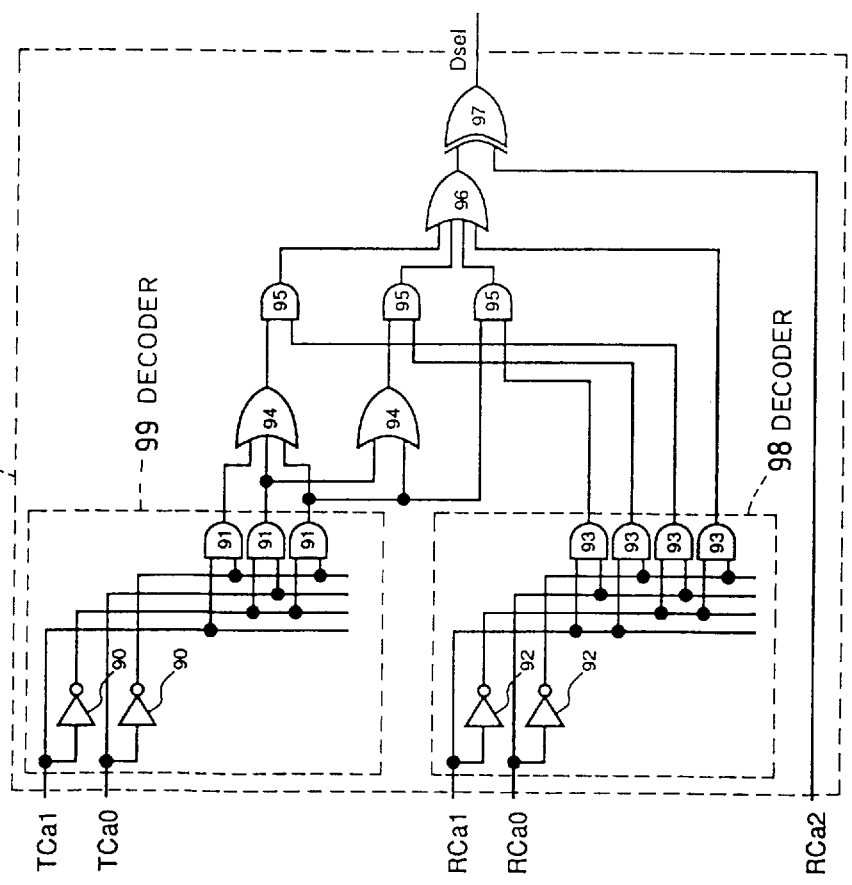
FIG. 11(a) is a view showing an example of the structure of a select-control-signal generating circuit of the semiconductor memory of FIG. 9.
FIG. 11(b) is a view showing variations in an output signal in relation to an inputted address in the select-control-signal generating circuit.

FIG. 11(a) shows a specific example of the select-control-signal generating circuit 83.

The select-control-signal generating circuit 83 in the drawing comprises: a decoder 98 consisting of two inverters 92 and four AND gates 93 for decoding the address RCa1 and RCa0 for designating the horizontal pixel position of a rectangular region; a decoder 99 consisting of two inverters 9C and three AND gates 91 for decoding the address TCa1 and TCa0 for designating a column address in a rectangular region; three OR gates 94, 94, and 96 and three AND gates 95 for generating a combinational logic of the outputs from these decoders 98 and 99; and EXOR gate 97 for controlling the output from the combinational logic based on the address RCa2.

The circuit shown in FIG. 11(a) outputs the signal Dsel as shown in the table of FIG. 11(b), depending on an inputted address. The circuit can select either one of the set of data A1(1) to A4(1) and the set of data B1(1) to B4(1), depending on the inputted address, by switching the multiplexer 82 such that the data bus 84 is selected when the output signal Dsel is High and that the data bus 85 is selected when the output signal Dsel is Low and can output the selected one to the random data I/O line. Consequently, it becomes possible to make a high-speed access to the regions 60 and 61 of the image data shown in FIG. 7(a), using the page mode of the memory.

Since the present embodiment is for solving the problem occurring in the case where plural sets of data in rectangular regions are stored in a plurality of memory cells arranged in a line direction of a memory cell array of a semiconductor memory, it will be appreciated that the structure of the present embodiment is not only applicable to the semiconductor memory having diagonal word lines described in the above first embodiment, but also to a normal semiconductor memory not having the above diagonal word lines.

(Fifth Embodiment)

As described above, with the structure shown in FIG. 9, it becomes possible to make an access to data in rectangular regions staring at an arbitrary pixel position in the horizontal direction by using the high-speed page mode of the semiconductor memory. Accordingly, the fourth embodiment is effective in improving the performance of a graphics system which performs the operation of filling in a geometric figure by drawing horizontal lines or the like.

Figure 12:
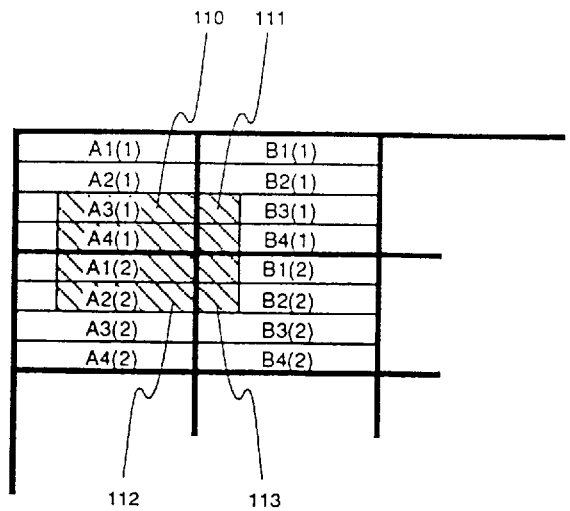
FIG. 12(a) is a view showing image data obtained through an access at an arbitrary horizontal position and at an arbitrary line position.
FIG. 12(b) is a view showing the position at which the image data of FIG. 12(a) is stored in a memory.
Figure 12B:
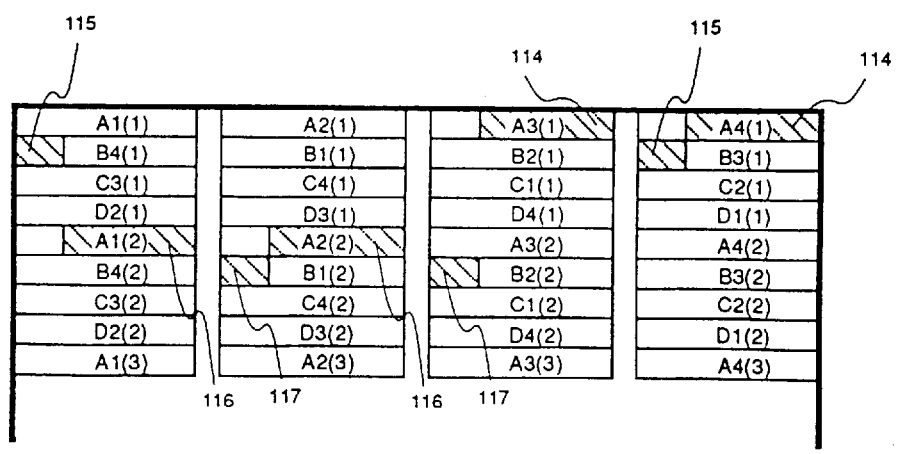

However, in the graphics system as well as in an image processing system, image data is frequently processed at an arbitrary position even in the line direction as well. In this case, image data divided into rectangular regions has been mapped in a semiconductor memory, as shown in FIGS. 4(a) and 4(b). In the memory shown in FIG. 12(b), the image data in the hatched regions 110, 111, 112, and 113 over the four rectangular regions shown in FIG. 12(a) is stored in the memory cells 114, 115, 116, and 117. As a result, the sets of rectangular-region data designated by the reference numerals 110, 111, 112, and 113 cannot be accessed using the page mode even in the memory having the structure shown in FIG. 9. In the case of performing image processing through a random port, a technique of switching the row address in the semiconductor memory each time the boundary between the regions 110 and 111 or between the regions 112 and 113 shown in FIG. 12(a) is changed in the image data or a technique of dividing a region subjected to image processing into the regions 110, 111, 112, and 113 and performing processing with respect to all of them in parallel becomes necessary, resulting in a factor in inhibiting higher-speed processing in making an access to a rectangular region.

The present embodiment proposes a structure which enables a high-speed access to a set of rectangular-region data starting at an arbitrary position both in the horizontal direction and in the line direction and hence is extremely effective in improving performance.

Below, a description will be given to the structure of a semiconductor memory in which a high-speed access is made to a set of rectangular-region data starting at an arbitrary position both in the horizontal direction and in the line direction.

Figure 13A:
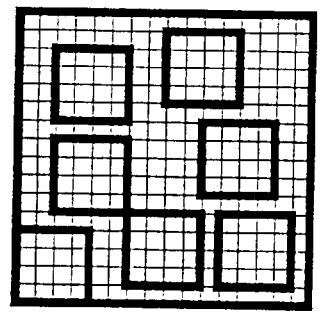
FIG. 13(a) is a view showing rectangular-region data at an arbitrary horizontal position and at an arbitrary line position.
Figure 13B:
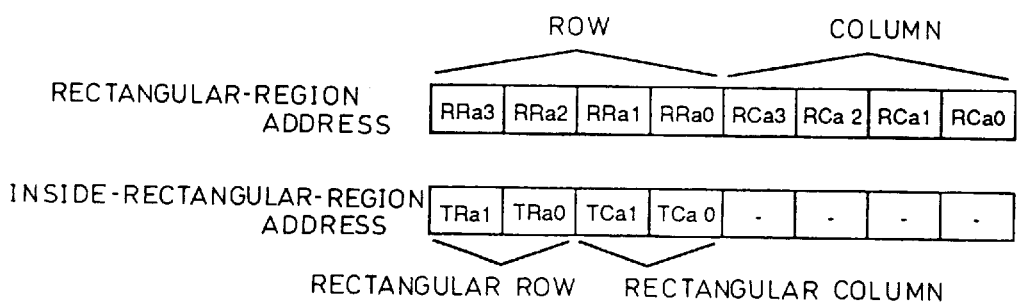
FIG. 13(b) is a view showing the addresses of the image data of FIG. 13(a) when it is accessed.

FIG. 13(a) shows image data in the case of making an access to a set of rectangular-region data starting at an arbitrary pixel position in the horizontal direction and in the line direction. FIG. 13(b) shows image addresses for the image data of FIG. 13(a).

As shown in FIG. 13(a), in order to pick up a rectangular region composed of 4×4 pixels from the image data composed of 16×16 pixels such that an access is made thereto and to designate an arbitrary position in the horizontal direction and in the line direction at which the rectangular region starts, 4 bits (RRa3 to RRa0) in the line direction and 4 bits (RCa3 to RCa0) in the horizontal direction are needed as a rectangular-region address, as shown in FIG. 13(b). In order to designate one of the pixels in the rectangular region, 2 bits (TRa1, TRa0) in the line direction and 2 bits (TCa1, TCa0) in the horizontal direction are needed.

Figure 14:
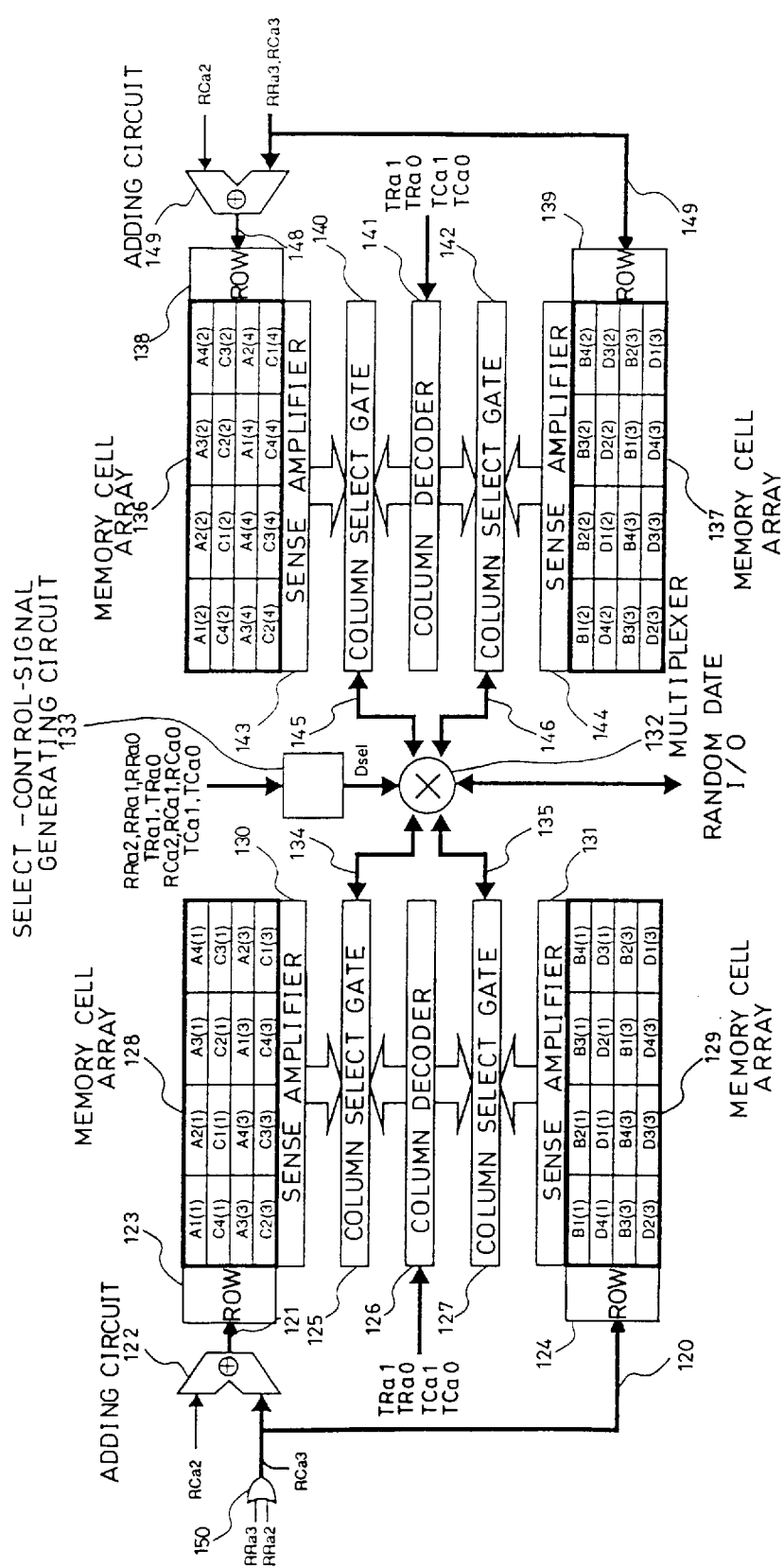
FIG. 14 is a view showing an example of the structure of a semiconductor memory according to a fifth embodiment of the present invention.

FIG. 14 shows the structure of a semiconductor memory which receives the image addresses shown in FIG. 13(b) and implements a high-speed access to the rectangular-region data starting at an arbitrary position in the horizontal direction and in the line direction.

In FIG. 14, reference numerals 129, 128, 137, and 136 designate memory cell arrays (first, second, third, and fourth array portions) formed by quartering the memory cell array shown in FIG. 4(b). In each of the memory cell arrays is stored a set of rectangular-region data as shown in FIG. 4(b).

Reference numerals 124, 123, 139, and 138 designate first, second, third, and fourth row decoders, respectively. To the first row decoder 124 is inputted a combination of a logic OR between the address RRa3 and the address RRa2 carried out by an OR gate 150. To the second row decoder 123 is inputted an address obtained by adding the address RCa2 to the address inputted to the above first row decoder 124 by means of an adding circuit (first address arithmetic means) 122. The first and second row decoders 124 and 123 generate respective signals for selecting one of the word lines in the memory cell array 129 and for selecting one of the word lines in the memory cell array 128.

To the third row decoder 139 is inputted a combination of the address RRa3 and the address RCa3. To the fourth row decoder 138 is inputted an address obtained by adding the address RCa2 to the address inputted to the above third row decoder 139 by means of an adding circuit (second address arithmetic means) 149. The third and fourth row decoders 139 and 138 generate respective signals for selecting one of the word lines in the memory cell array 137 and for selecting one of the word lines in the memory cell array 136.

With the above structure, the addresses 120, 121, 147, and 148 supplied to the first to fourth row decoders 124, 123, 139, and 138 and data in the memory cell arrays 129, 128, 137, and 136 selected based on the supplied addresses 120, 121, 147, and 148 are as shown in FIG. 15. As can be seen from FIG. 15, sequential sets of rectangular-region data in the horizontal direction and in the line direction in the memory cell arrays 129, 128, 137, and 136 are selected based on the address RRa3, RRa2, RCa3, and RCa2 supplied to the row decoders 124, 123, 139, and 138. Accordingly, in the example shown in FIG. 12, the sets of data A1(1) to A4(1), B1(1) to B4(1), A1(2) to A4(2), and B1(2) to B4(2) in the respective memory cell arrays 128, 129, 136, and 137 are simultaneously accessed in the memory in making an access to the regions 110, 111, 112, and 113 of the image data shown in FIG. 12(a).

In FIG. 14, reference numerals 131, 130, 144, and 143 designate first, second, third, and fourth sense amplifiers for individually amplifying sets of data on bit lines of the respective memory cell arrays 129, 128, 137, and 136. Reference numerals 127, 125, 142, and 140 designate first, second, third, and fourth column select gates for selectively connecting the bit lines of the respective memory cell arrays 129, 128, 137, and 136 to data buses 135, 134, 146, and 145 based on signals from column decoders 126 and 141, which will be described later. Reference numerals 126 and 141 designate first and second column decoders each supplied with the common inside-rectangular-region address TR1a, RTa0, TCa1, and TCa0 and supplying a common select signal to the above column select gates 127, 125, 142, and 140.

In the above structure, for the four sets of rectangular-region data in the memory cell arrays 129, 128, 137, and 136 selected based on the address RRa3, RRa2, RCa3, and RC2, sets of pixel data at the same positions of the four sets of rectangular-region data designated by the inside-rectangular-region address TRa1, TRa0, TCa1, and TCa0 are selected by the column select gates 127, 125, 142, and 140 and connected to the data buses 135, 134, 146, and 145.

A select-control-signal generating circuit (select-control-signal generating means) 133 is a circuit for controlling a multiplexer (data selecting means) 132 such that it selects any one of the four sets of rectangular-region data selected by the column decoders 126 and 141 and column select gates 127, 125, 142, and 140. The multiplexer 132 is controlled by a control signal Dsel outputted from the select-control-signal generating circuit 133 so as to select any one of the data buses 135, 134, 146, and 145 and to connect the selected one to a random data I/O line.

Figure 16:
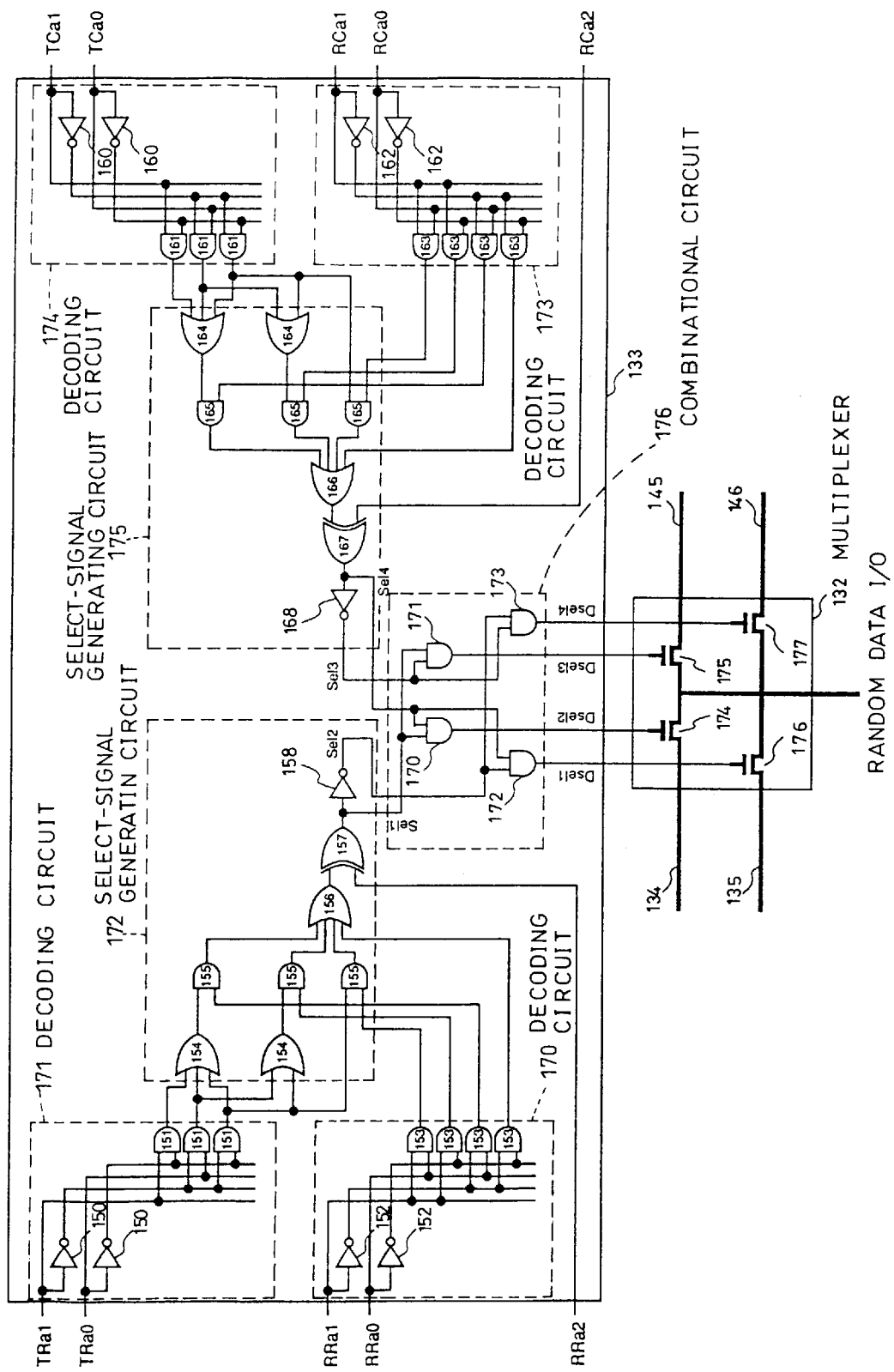
FIG. 16 is a view showing an example of the structure of a select-control-signal generating circuit of the semiconductor memory of FIG. 14.

FIG. 16 shows a specific example of the above select-control-signal generating circuit 133 and multiplexer 132.

In the drawing, the select-control-signal generating circuit 133 comprises: a decoder 170 consisting of two inverters 152 and of four AND circuits 153 for decoding the address RRa1 and RRa0 for designating the line position of a rectangular region; a decoder 171 consisting of two inverters 150 and three AND gates 151 for decoding the address TRa1 and TRa0 for designating a line address in a rectangular region; a select-signal generating circuit 172 which consists of three OR gates 154, 154, and 156 and three AND gates 155 for generating a combinational logic of the outputs from the decoders 170 and 171 and of an EXOR gate 157 and an inverter 158 for controlling the output from the combinational logic based on the address RRa2 and which outputs select signals Sel1 and Sel2; a decoder 173 consisting of two inverters 162 and four AND gates 163 for decoding the address RCa1 and RCa0 for designating the horizontal pixel position of a rectangular region; a decoder 174 consisting of two inverters 160 and three AND gates 161 for decoding the addresses TCa1 and TCa0 for designating a horizontal pixel position in a rectangular region; a select-signal generating circuit 175 which consists of three OR gates 164, 164, and 166 and three AND gates 165 for generating a combinational logic of the outputs from the decoders 173 and 174 and of an EXOR gate 167 and an inverter 168 for controlling the output from the combinational logic based on the address RCa2 and which outputs select signals Sel3 and Sel4; and a combinational circuit 176 consisting of four AND gates 170, 171, 172, and 173 for combining the select signals Sel1 to Sel4.

With the circuit shown in FIG. 16, the values of the select signals Sel1 to Sel4 become as shown in FIG. 17, depending on the inputted address.

In FIG. 16, the multiplexer 132 consists of transfer gates 174, 176, 175, and 177 which select any one of the data buses 134, 135, 145, and 146 and connects the selected one to the random data I/O line.

By switching the multiplexer 132 based on the outputs Dsel1 to Dsel4 from the select-control-signal generating circuit 133 obtained by combining the select signals Sel1 to Sel4 based on the inputted address shown in FIG. 17 by means of the AND gates 170, 171, 172, and 173 of the combinational circuit 176, it becomes possible to select any one of the sets of data A1(1) to A4(1), A1(2) to A4(2), B1(1) to B4(1) and B1(2) to B4(2) and output the selected one to the random I/O line. Therefore, it becomes possible to make a high-speed access to the regions designated by the reference numerals 110, 111, 112, and 113 of the image data shown in FIG. 12(a) by using the page mode of the semiconductor memory.

Thus, the structure shown in FIG. 14 enables an access to a set of rectangular-region data starting at an arbitrary pixel position in the horizontal direction and in the line direction by using the high-speed page mode of the semiconductor memory.

Since the present embodiment is for solving the problem occurring in the case where plural sets of data in rectangular regions are stored in a plurality of memory cells arranged in a line direction of a memory cell array of a semiconductor memory, similarly to the above fourth embodiment, it will be appreciated that the structure of the present embodiment is not only applicable to the semiconductor memory having diagonal word lines described in the above first embodiment, but also to a normal semiconductor memory not having the above diagonal word lines.

(Sixth Embodiment)

As described above, with the semiconductor memory of the present invention, it becomes possible to select a set of rectangular-region data or one line of data on an image and to simultaneously read the selected plural sets of data onto a plurality of bit lines in a video memory for storing image data. In the present embodiment, an arithmetic device for processing the sets of data on the bit lines in parallel is provided on the same chip on which the semiconductor memory is provided, thus implementing a high-speed image processor.

Figure 18:
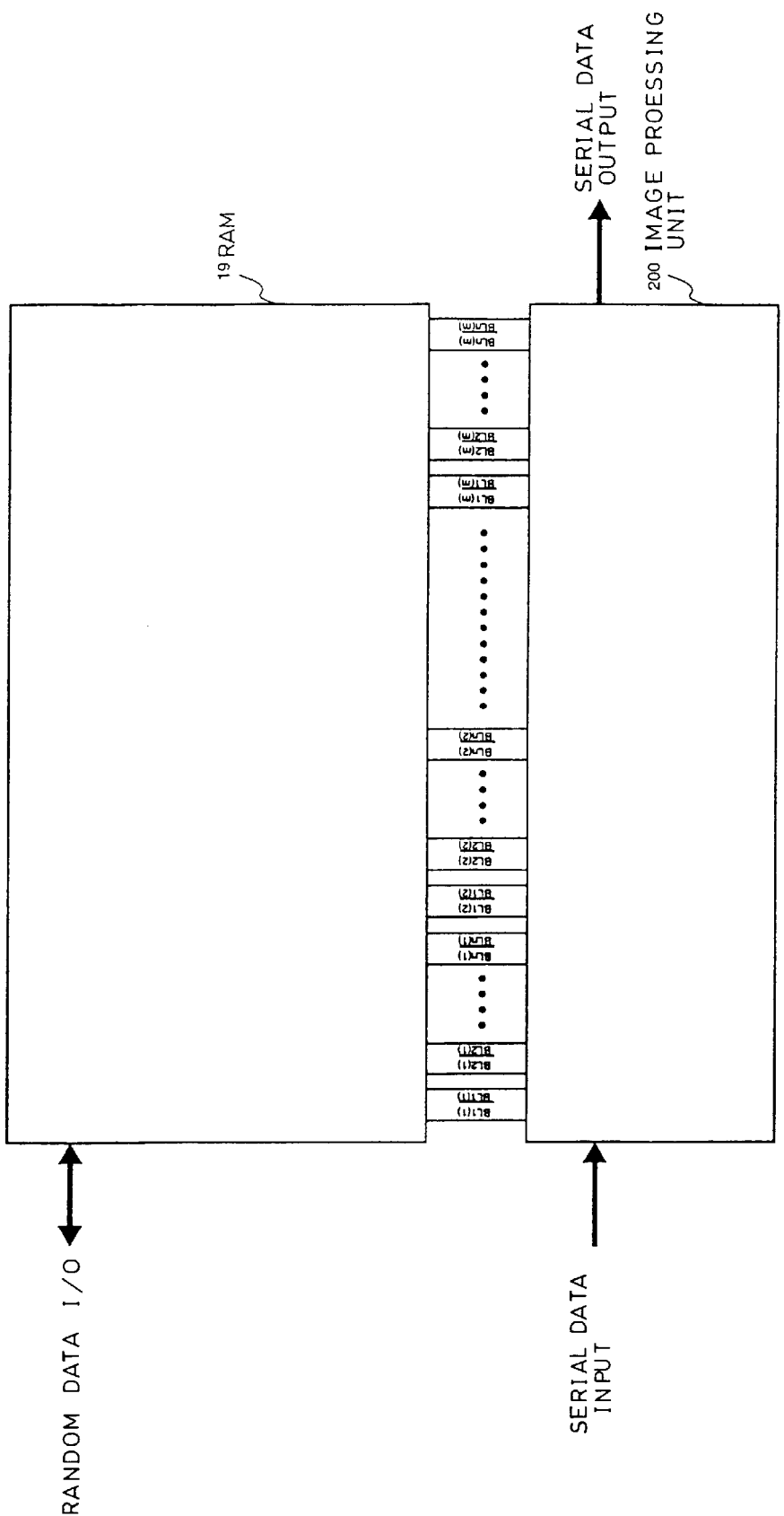
FIG. 18 is a view showing an example of the structure of an image processor according to a sixth embodiment of the present invention.

FIG. 18 shows an example of the structure of an image processor according to the present embodiment.

In the drawing are shown: the random-access memory (RAM) 19 shown in FIG. 1; and an image processing unit 200 to which the bit lines BL0(1), /BL0(1) to BLn(m), and /BLn(m) of the RAM 19 are connected.

Figure 19:
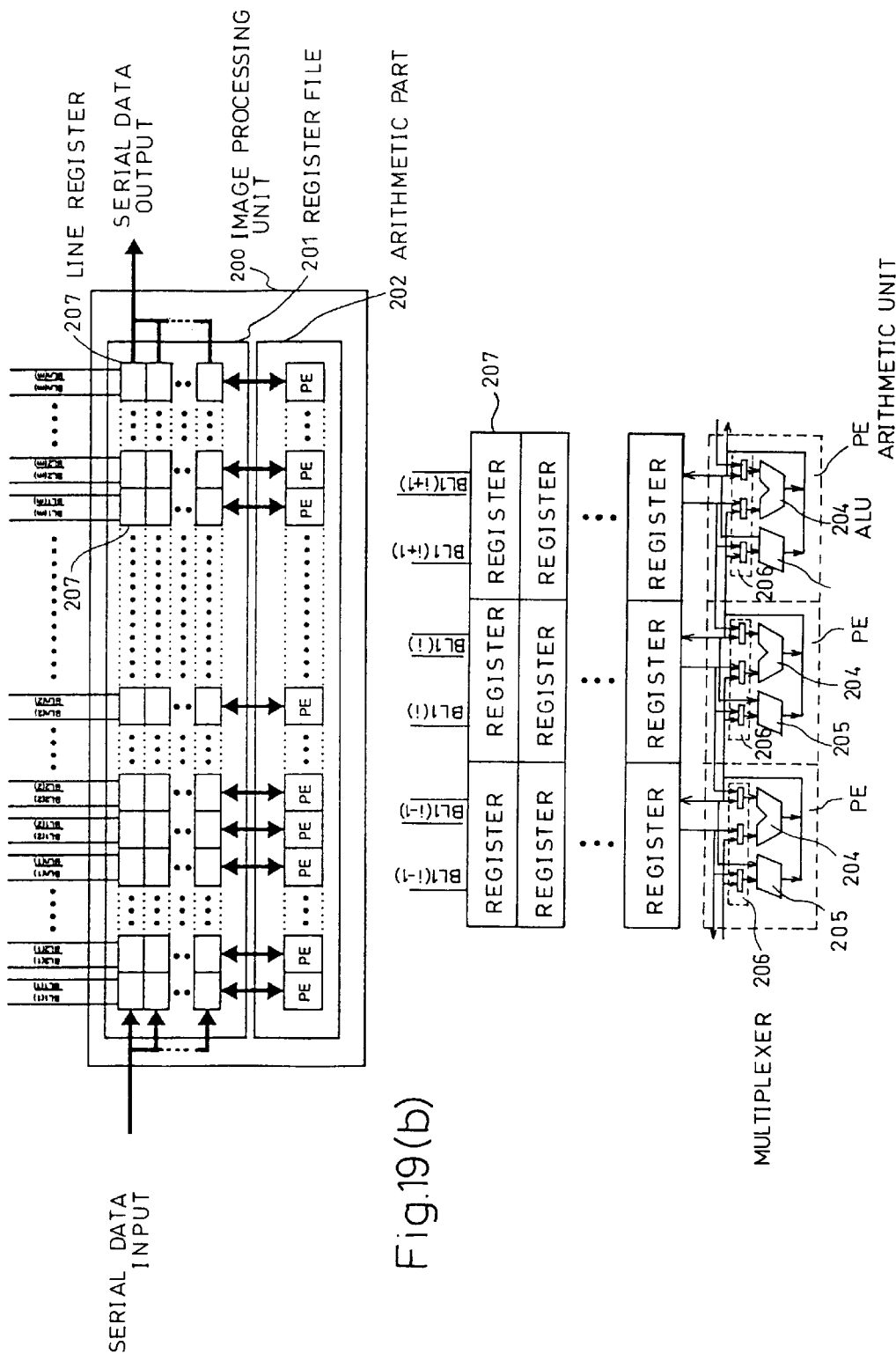
FIG. 19(a) is a view showing an example of the structure of an arithmetic processing unit of the image processor of FIG. 18.
FIG. 19(b) is a view showing an example of the structure of an image processing unit of FIG. 19(a)
Figure 20:
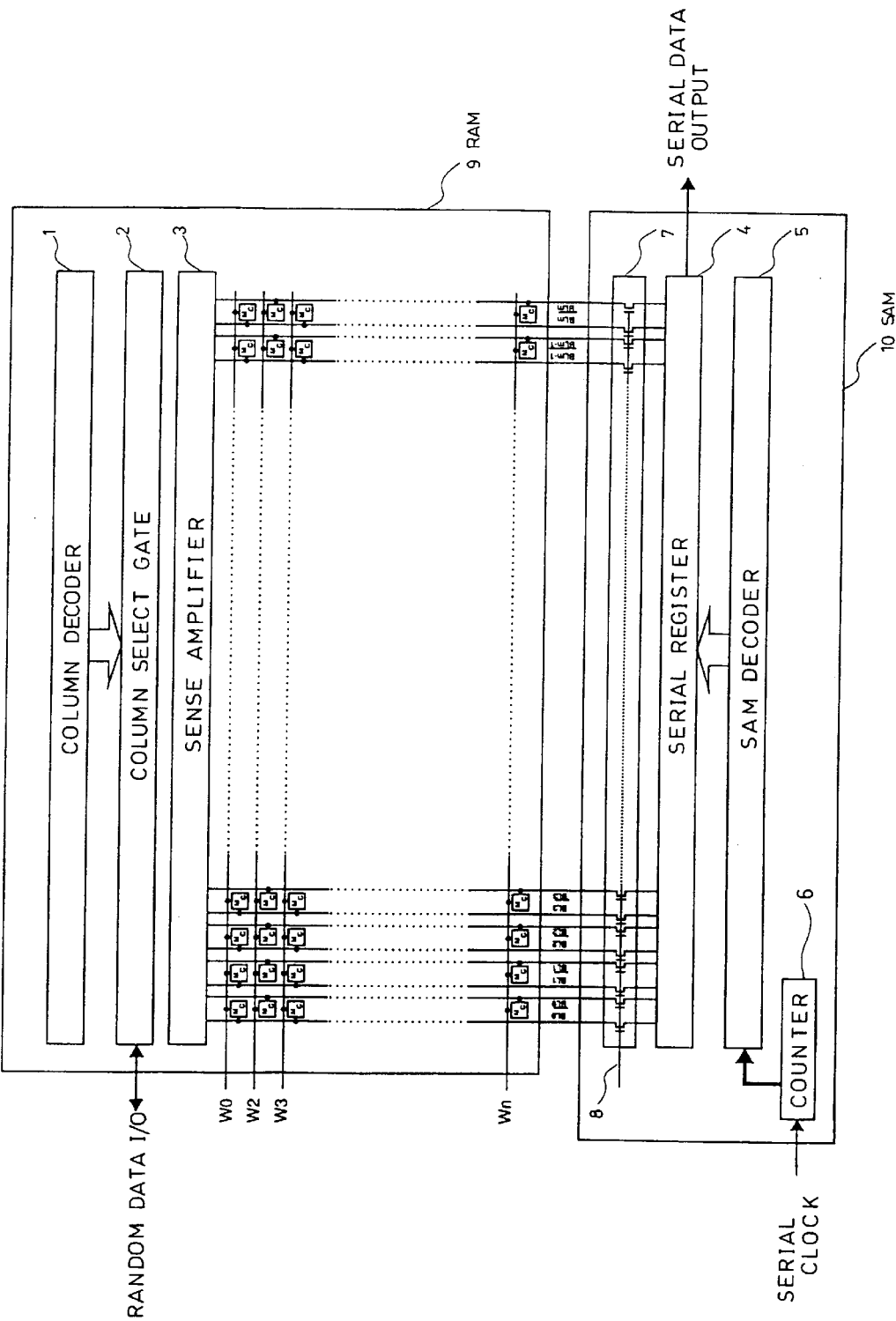
FIG. 20 is a view showing an example of the structure of a conventional video memory.

FIG. 19(a) shows an example of the structure of the above image processing unit 200. In the drawing are shown: a register file 201 comprising line registers 207 in a plurality of stages consisting of registers which are equal in number to the bit lines BL0(1), /BL0(1) to BLn(m), and /BLn(m); and an arithmetic part 202. The above register file 201 is for storing data from the bit lines BL0(1), /BL0(1) to BLn(m), and /BLn(m), data from a serial data input, and an arithmetic result from the arithmetic part 202.

The above arithmetic part 202 comprises arithmetic units PE which are equal in number to the registers in one stage of the line registers 207. As shown in FIG. 19(b), each of the arithmetic units PE consists of: an ALU 204, a shifter 205, and a multiplexer 206 for selecting between input signals to the ALU and shifter 205. The above ALU 204 and shifter 205 receives the output from the register in the same line, in its upper position, or in its lower position or the output from the arithmetic unit PE in its upper position, performs an arithmetic operation, and outputs the arithmetic result to the register or to the arithmetic unit PE in its upper position.

Examples of image processing include removal of noise from an image and image enhancement used in a process prior to image recognition. The image processing for the noise removal and image enhancement is performed by local-space product-sum operation. The local-space product-sum operation is a process in a local region composed of, e.g., 3×3=9 pixels. In the processing of 3×3 pixels, the local-space product-sum operation is performed in accordance with the following equation:

$$g(x, y) = \sum_{i=-1}^{1} \sum_{j=-1}^{1} w(i, j) \cdot f(x + i, y + j).$$

Specifically, a processed pixel g(x, y) is obtained by performing a product-sum operation with respect to the corresponding pixel data f(x, y) in FIG. 22(a), data on 8 pixels surrounding the processed pixel g(x, y), and weighted coefficients W of FIG. 22(b). The foregoing process is performed with respect to all the pixels in the image data, thereby obtaining processed image G. If it is assumed that the weighted coefficients W are the integrating coefficients shown in Example 1 of the weighted coefficients of FIG. 22(d), a smoothing process such as noise removal can be performed. Alternatively, if it is assumed that the weighted coefficients are the differential coefficients shown in Example 2 of the weighted coefficients of FIG. 22(e), an enhancing process such as edge detection can be performed. FIG. 23 shows the process in the image processing unit 200 in the case of performing edge detection using the differential coefficients shown in Example 2 of the weighted coefficients of FIG. 22(e).

Below, a description will be given to the process of edge detection. To the RAM 19 has been inputted image data to be processed. One line of data in the RAM 19 is selected and sequentially transferred, thereby transferring the image data in the line y, in its upper line (y−1), and in its lower line (y+1) to be processed to line registers LR1 to LR3.

In line registers LR4 and LR5 are stored respective weighted coefficients. Since two types of coefficients W having respective values of "−1" and "8" are used here, the line register LR4 stores "−1" in its all the rows, while the line register LR5 stores "8" in its all the rows. Since the weighted coefficients W have fixed values during the process, they are previously inputted from a serial data input terminal of the image processing unit 200 to the line registers LR4 and LR5.

Line registers LR6 and LR7 are used to store intermediate data. In each row of the line register LR6 is stored, as u, the sum of values obtained by individually multiplying sets of pixel data in the same columns of the line registers LR1 to LR3 by "−1," which is the content of the line register LR4.

In each row of the line register LR7 is stored, as v, the sum of values obtained by individually multiplying sets of pixel data in the same columns of the line register LR1 and LR3 by "−1," which is the content of the line register LR4, and a value obtained by multiplying a set of data in the same column of the line register LR2 by "8," which is the content of the line register LR5.

The above arithmetic operations will be easily executed by reading data from the register file 201 in the same column, performing arithmetic operations by means of the ALU 204 or shifter 205 in the arithmetic unit PE, and writing the result in the register file 201.

By using the two types of intermediate data u and v thus obtained, each of the arithmetic units PE(x) adds up the intermediate data v(x) in the same column, the intermediate data u(x−1) in its left column, and the intermediate data u(x+1) in its right column and writes the sum thereof as an addition result g(x, y) in the same column of the line register LR8. In this manner, the addition results g in all the pixels in a line in process y are simultaneously calculated and written in the line register LR8. Since each of the arithmetic unit PE is constituted so as to latch not only a set of data in the same column of the register file 201, but also sets of data in its left and right columns, the above arithmetic operations can be easily executed. By sequentially reading the arithmetic results g written in the line register LR8 from the serial data output, the result of the edge detecting process is outputted.

In the local-space product-sum operation shown in FIG. 22, the processed image is obtained by performing the process with respect to pixel data in a small region composed of, e.g., 3×3 pixels centering around the pixel of concern and executing arithmetic operations using all the pixels on the whole display screen as the pixels of concern. Consequently, if the above-described process is performed after repeatedly reading one line of data from the RAM 19, transferring it to the register file 201, and storing three lines of data in the register file 201, image processing for a plurality of sets of data composing one of the three lines can be performed in parallel, thereby implementing high-speed image processing.

The image processing requires a large number of processes other than the local-space product-sum operation described above. For example, in a DCT (Discrete Cosine Transfer) process for data compression, a product-sum operation with a coefficient is performed with respect to 8×8 pixel data, similarly to the process of FIG. 22. However, unlike the local-space product-sum operation, the DCT process is a product-sum operation for each set of rectangular-region image data composed of 8×8 pixels obtained through division at a fixed position, whereby product-sum operations with 64 coefficients are performed with respect to respective sets of data on 64 pixels and 64 sets of DCT arithmetic data are outputted. The coefficients to be used have different values, so that numerous line registers should be provided in order to use a processing method similar to the local-space product-sum operation described above. In the case of performing the DCT process, a rectangular-region image data in the RAM 19 is selected and transferred to a line register in the register file 201, while coefficients have been previously inputted to the other line register in the register file 201. Thus, by storing the rectangular-region image data and the coefficients in the register file 201, calculating the product of the image data in each column and the corresponding coefficient by means of the arithmetic unit PE in the same column, and adding up the products of the respective sets of image data and the coefficients, while shifting the sets of image data in the line registers for storing the image data by one pixel each, the 64 sets of CDT arithmetic data can be obtained in parallel.

Thus, with the structure shown in FIG. 18, it becomes possible to implement a high-speed image processor which latches one line of data read from the RAM 19 into the register file 201 so as to perform arithmetic operations in parallel with respect to one line of the image data or which latches a set of rectangular-region data read from the RAM 19 into the register file 201 so as to perform arithmetic operations in parallel with respect to the set of rectangular-region data of the image data. With the structure shown in FIG. 18, on the other hand, one line of data read from the RAM 19 is latched into the register file 201 and sets of image data are sequentially outputted from the serial data output terminal one at a time, thereby implementing the function of the conventional video memory.

I claim:

1. A column decoder comprising:

a first predecoder for receiving a part of a column address and predecoding the received column address;

a second predecoder for receiving a remaining portion of said column address and predecoding the received column address;

a predecoded output switching means for switching a bit position of an output from said second predecoder based on a part of a row address; and a main decoder for generating a column select signal for controlling a column select gate based on an output from said first predecoder and on an output from said predecoded output switching means.

2. A semiconductor memory comprising:

a memory cell array having a plurality of memory cell blocks in each of which a single or a plurality of memory cells arranged in a column direction are connected to a sub word line, said plurality of memory cell blocks being arranged in an array;

horizontal word lines extending in horizontal directions and diagonal word lines extending in diagonal directions;

a word-line selecting means for receiving a word-line select signal, selecting a given one of said horizontal or diagonal word lines based on the word-line select signal which has been received, and connecting the selected word line to said sub word line in each of the memory cell blocks corresponding to the word line;

a serial access memory for receiving and storing a plurality of signals, said plurality of stored signals being sequentially accessed in accordance with a serial clock;

a transfer means for transferring and inputting signals on the plurality of bit lines to said serial access memory; and a column decoder;

wherein said ones of said plurality of memory cell blocks which are arranged in one of the horizontal directions or in one of the diagonal directions are selected based on the word-line select signal and sets of data in the plurality of memory cells in the plurality of selected memory cell blocks arranged in the horizontal direction or in the diagonal direction are outputted onto respective pairs of bit lines, said column decoder comprising:

a first predecoder for receiving a part of a column address and predecoding the received column address, a second precoder for receiving a remaining portion of said column address and predecoding the received column address, a precoded output switching means for switching a bit position of an output from said second predecoder based on a part of a row address; and a main decoder for generating a column select signal for controlling a column select gate based on an output from said first predecoder and on an output from said predecoded output switching means.

3. A semiconductor memory comprising:

a memory cell array having a plurality of memory cell blocks in each of which a single or a plurality of memory cells arranged in a column direction are connected to a sub word line, said plurality of memory cell blocks being arranged in an array;

horizontal word lines extending in horizontal directions and diagonal word lines extending in diagonal directions;

a word-line selecting means for receiving a word-line select signal, selecting a given one of said horizontal or diagonal word lines based on the word-line select signal which has been received, and connecting the selected word line to said sub word line in each of the memory cell blocks corresponding to the word line; and a column decoder;

wherein said ones of said plurality of memory cell blocks which are arranged in one of the horizontal directions or in one of the diagonal directions are selected based on the word-line select signal and sets of data in the plurality of memory cells in the plurality of selected memory cell blocks arranged in the horizontal direction or in the diagonal direction are outputted onto respective pairs of bit lines, said column decoder comprising:

a first predecoder for receiving a part of a column address and predecoding the received column address, a second precoder for receiving a remaining portion of said column address and predecoding the received column address, a precoded output switching means for switching a bit position of an output from said second predecoder based on a part of a row address; and a main decoder for generating a column select signal for controlling a column select gate based on an output from said first predecoder and on an output from said predecoded output switching means.

* * * * *